US012486574B2

(12) United States Patent
Luo et al.

(10) Patent No.: US 12,486,574 B2
(45) Date of Patent: Dec. 2, 2025

(54) THERMALLY CONTROLLED CHANDELIER SHOWERHEAD

(71) Applicant: Lam Research Corporation, Fremont, CA (US)

(72) Inventors: Bin Luo, Beaverton, OR (US); Timothy Scott Thomas, Wilsonville, OR (US); Matthew B. Schick, Pflugerville, TX (US); John Michael Wiltse, Lake Oswego, OR (US); Sean M. Donnelly, Portland, OR (US); Michael John Selep, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 791 days.

(21) Appl. No.: 17/753,083

(22) PCT Filed: Aug. 21, 2020

(86) PCT No.: PCT/US2020/070437
§ 371 (c)(1),
(2) Date: Feb. 17, 2022

(87) PCT Pub. No.: WO2021/042116
PCT Pub. Date: Apr. 3, 2021

(65) Prior Publication Data
US 2022/0282377 A1 Sep. 8, 2022

Related U.S. Application Data

(60) Provisional application No. 62/891,211, filed on Aug. 23, 2019.

(51) Int. Cl.
*C23C 16/455* (2006.01)
*H01J 37/32* (2006.01)

(52) U.S. Cl.
CPC .... *C23C 16/45565* (2013.01); *C23C 16/4557* (2013.01); *C23C 16/45572* (2013.01); *H01J 37/3244* (2013.01)

(58) Field of Classification Search
CPC .......... C23C 16/45565; C23C 16/4557; C23C 16/45572; C23C 16/4558; H01J 37/3244; H01J 37/32449
See application file for complete search history.

(56) References Cited

U.S. PATENT DOCUMENTS 3,215,508 A 11/1965 Piester
4,577,203 A 3/1986 Kawamura
(Continued)

FOREIGN PATENT DOCUMENTS

CN 1445822 A 10/2003
CN 1574229 A 2/2005
(Continued)

OTHER PUBLICATIONS

Chapman, (1980) "Glow Discharge Processes: Sputtering And Plasma Etching," Voltage Distribution in RF Systems, John Wiley & Sons, pp. 152-156.
(Continued)

*Primary Examiner* — Kurt Sweely
(74) *Attorney, Agent, or Firm* — Weaver Austin Villeneuve & Sampson LLP

(57) ABSTRACT

Showerheads for semiconductor processing equipment are disclosed that include various features designed to promote thermal control of the showerhead in high-temperature applications.

18 Claims, 12 Drawing Sheets

(56) References Cited

U.S. PATENT DOCUMENTS

| | | | | |
|---|---|---|---|---|
| 4,890,780 | A | 1/1990 | Mimata et al. | |
| 4,960,488 | A | 10/1990 | Law et al. | |
| 4,993,485 | A | 2/1991 | Gorman | |
| 5,106,453 | A | 4/1992 | Benko et al. | |
| 5,186,756 | A | 2/1993 | Benko et al. | |
| 5,212,116 | A | 5/1993 | Yu | |
| 5,232,508 | A | 8/1993 | Arena et al. | |
| 5,268,034 | A | 12/1993 | Vukelic | |
| 5,286,519 | A | 2/1994 | Vukelic | |
| 5,366,557 | A | 11/1994 | Yu | |
| 5,376,213 | A | 12/1994 | Ueda et al. | |
| 5,423,936 | A * | 6/1995 | Tomita .............. | H01J 37/32724 156/345.47 |
| 5,446,824 | A | 8/1995 | Moslehi | |
| 5,452,396 | A | 9/1995 | Sopori | |
| 5,453,124 | A | 9/1995 | Moslehi et al. | |
| 5,468,298 | A | 11/1995 | Lei et al. | |
| 5,581,874 | A | 12/1996 | Aoki et al. | |
| 5,589,002 | A | 12/1996 | Su | |
| 5,614,026 | A | 3/1997 | Williams | |
| 5,643,394 | A | 7/1997 | Maydan et al. | |
| 5,653,479 | A | 8/1997 | Henderson | |
| 5,670,218 | A | 9/1997 | Baek | |
| 5,680,013 | A | 10/1997 | Dornfest et al. | |
| 5,741,363 | A | 4/1998 | Van et al. | |
| 5,766,364 | A | 6/1998 | Ishida et al. | |
| 5,806,980 | A | 9/1998 | Berrian | |
| 5,817,406 | A | 10/1998 | Cheung et al. | |
| 5,834,068 | A | 11/1998 | Chern et al. | |
| 5,882,411 | A | 3/1999 | Zhao et al. | |
| 5,948,704 | A | 9/1999 | Benjamin et al. | |
| 5,950,925 | A | 9/1999 | Fukunaga et al. | |
| 5,958,140 | A | 9/1999 | Arami et al. | |
| 5,992,453 | A | 11/1999 | Zimmer | |
| 5,996,528 | A | 12/1999 | Berrian et al. | |
| 6,010,748 | A | 1/2000 | Van et al. | |
| 6,022,413 | A | 2/2000 | Shinozaki et al. | |
| 6,022,586 | A | 2/2000 | Hashimoto et al. | |
| 6,025,013 | A | 2/2000 | Heming et al. | |
| 6,054,013 | A | 4/2000 | Collins et al. | |
| 6,059,885 | A | 5/2000 | Ohashi et al. | |
| 6,112,697 | A | 9/2000 | Sharan et al. | |
| 6,113,700 | A | 9/2000 | Choi | |
| 6,140,215 | A | 10/2000 | Foster et al. | |
| 6,151,203 | A | 11/2000 | Shamouilian et al. | |
| 6,190,732 | B1 | 2/2001 | Omstead et al. | |
| 6,205,869 | B1 | 3/2001 | Schadt et al. | |
| 6,237,528 | B1 | 5/2001 | Szapucki et al. | |
| 6,245,192 | B1 | 6/2001 | Dhindsa et al. | |
| 6,289,842 | B1 | 9/2001 | Tompa | |
| 6,302,965 | B1 * | 10/2001 | Umotoy ............ | C23C 16/45576 118/715 |
| 6,364,949 | B1 | 4/2002 | Or et al. | |
| 6,379,056 | B1 | 4/2002 | Ueda | |
| 6,415,736 | B1 | 7/2002 | Hao et al. | |
| 6,444,039 | B1 | 9/2002 | Nguyen | |
| 6,453,992 | B1 | 9/2002 | Kim | |
| 6,460,482 | B1 | 10/2002 | Kuibira et al. | |
| 6,499,425 | B1 | 12/2002 | Sandhu et al. | |
| 6,537,420 | B2 | 3/2003 | Rose | |
| 6,565,661 | B1 | 5/2003 | Nguyen | |
| 6,616,767 | B2 | 9/2003 | Zhao et al. | |
| 6,635,117 | B1 | 10/2003 | Kinnard et al. | |
| 6,716,287 | B1 | 4/2004 | Santiago et al. | |
| 6,793,733 | B2 | 9/2004 | Janakiraman et al. | |
| 6,821,347 | B2 | 11/2004 | Carpenter et al. | |
| 6,883,733 | B1 | 4/2005 | Lind | |
| 6,921,556 | B2 | 7/2005 | Shimizu et al. | |
| 6,983,892 | B2 | 1/2006 | Noorbakhsh et al. | |
| 7,217,326 | B2 | 5/2007 | Lee | |
| 7,270,713 | B2 | 9/2007 | Blonigan et al. | |
| 7,296,534 | B2 | 11/2007 | Fink | |
| 7,381,644 | B1 | 6/2008 | Subramonium et al. | |
| 7,387,685 | B2 | 6/2008 | Carpenter et al. | |
| 7,462,243 | B2 | 12/2008 | Laflamme, Jr. et al. | |
| D593,640 | S | 6/2009 | Schoenherr et al. | |
| 7,585,386 | B2 | 9/2009 | Okumura et al. | |
| 7,682,946 | B2 | 3/2010 | Ma et al. | |
| 7,712,434 | B2 | 5/2010 | Dhindsa et al. | |
| 7,737,035 | B1 | 6/2010 | Lind et al. | |
| 7,820,556 | B2 | 10/2010 | Hsu et al. | |
| 7,850,779 | B2 | 12/2010 | Ma et al. | |
| 7,883,632 | B2 | 2/2011 | Honda et al. | |
| 7,918,938 | B2 | 4/2011 | Provencher et al. | |
| 7,955,990 | B2 | 6/2011 | Henri et al. | |
| 7,981,777 | B1 | 7/2011 | Subramonium et al. | |
| 7,981,810 | B1 | 7/2011 | Subramonium et al. | |
| 7,993,457 | B1 | 8/2011 | Krotov et al. | |
| 8,110,493 | B1 | 2/2012 | Subramonium et al. | |
| 8,137,467 | B2 * | 3/2012 | Meinhold ......... | C23C 16/45565 118/724 |
| 8,187,679 | B2 | 5/2012 | Dickey et al. | |
| 8,309,473 | B2 | 11/2012 | Hsu et al. | |
| 8,435,608 | B1 | 5/2013 | Subramonium et al. | |
| 8,443,756 | B2 | 5/2013 | Fischer et al. | |
| 8,562,785 | B2 | 10/2013 | Kang et al. | |
| 8,673,080 | B2 | 3/2014 | Meinhold et al. | |
| 8,721,791 | B2 | 5/2014 | Tiner et al. | |
| 8,728,956 | B2 | 5/2014 | LaVoie et al. | |
| 8,980,006 | B2 | 3/2015 | Huh et al. | |
| 9,017,481 | B1 | 4/2015 | Pettinger et al. | |
| 9,032,906 | B2 | 5/2015 | Ma et al. | |
| 9,034,142 | B2 | 5/2015 | Bartlett et al. | |
| 9,121,097 | B2 | 9/2015 | Mohn et al. | |
| 9,144,147 | B2 | 9/2015 | Yang et al. | |
| 9,314,854 | B2 | 4/2016 | Huang et al. | |
| 9,441,296 | B2 | 9/2016 | Sabri et al. | |
| 9,449,795 | B2 | 9/2016 | Sabri et al. | |
| 9,476,120 | B2 | 10/2016 | Meinhold et al. | |
| 9,502,218 | B2 | 11/2016 | Chen et al. | |
| 9,741,545 | B2 | 8/2017 | Chen et al. | |
| 9,758,868 | B1 | 9/2017 | Breiling et al. | |
| 9,793,096 | B2 | 10/2017 | Kang et al. | |
| 9,892,908 | B2 | 2/2018 | Pettinger et al. | |
| 10,022,689 | B2 | 7/2018 | Shareef et al. | |
| 10,023,959 | B2 | 7/2018 | Sung et al. | |
| 10,056,233 | B2 | 8/2018 | Chen et al. | |
| 10,087,524 | B2 | 10/2018 | Tiner et al. | |
| 10,221,484 | B2 | 3/2019 | Meinhold et al. | |
| 10,253,412 | B2 | 4/2019 | Thomas et al. | |
| 10,266,947 | B2 | 4/2019 | Madsen et al. | |
| 10,358,722 | B2 | 7/2019 | Wiltse et al. | |
| 10,378,107 | B2 | 8/2019 | Chandrasekharan et al. | |
| 10,400,333 | B2 | 9/2019 | Sabri et al. | |
| 10,403,474 | B2 | 9/2019 | Phillips et al. | |
| 10,458,019 | B2 | 10/2019 | Wang et al. | |
| 10,494,717 | B2 | 12/2019 | Sung et al. | |
| 10,557,198 | B2 | 2/2020 | Lee et al. | |
| 10,584,415 | B2 | 3/2020 | Meinhold et al. | |
| 10,741,365 | B2 | 8/2020 | Chandrasekharan et al. | |
| 10,858,737 | B2 | 12/2020 | White et al. | |
| 10,975,467 | B2 | 4/2021 | She et al. | |
| 10,984,987 | B2 | 4/2021 | Selep et al. | |
| 11,164,737 | B2 | 11/2021 | Hawrylchak et al. | |
| 11,276,585 | B2 | 3/2022 | Lee et al. | |
| 11,384,432 | B2 | 7/2022 | Rasheed et al. | |
| 11,715,667 | B2 | 8/2023 | Cui et al. | |
| 12,203,168 | B2 | 1/2025 | Vellanki et al. | |
| 2001/0027026 | A1 | 10/2001 | Dhindsa et al. | |
| 2001/0035127 | A1 | 11/2001 | Metzner et al. | |
| 2002/0017243 | A1 | 2/2002 | Pyo | |
| 2002/0069969 | A1 | 6/2002 | Rose | |
| 2002/0123230 | A1 | 9/2002 | Hubacek | |
| 2002/0134507 | A1 | 9/2002 | DeDontney et al. | |
| 2002/0144783 | A1 | 10/2002 | Tran et al. | |
| 2002/0144785 | A1 | 10/2002 | Srivastava et al. | |
| 2002/0162630 | A1 | 11/2002 | Satoh et al. | |
| 2002/0179012 | A1 | 12/2002 | Takatsu et al. | |
| 2003/0010452 | A1 | 1/2003 | Park et al. | |
| 2003/0019428 | A1 | 1/2003 | Ku et al. | |
| 2003/0051665 | A1 | 3/2003 | Zhao et al. | |
| 2003/0054099 | A1 | 3/2003 | Jurgensen et al. | |
| 2003/0066607 | A1 | 4/2003 | White et al. | |
| 2003/0070760 | A1 | 4/2003 | Kim et al. | |

(56) References Cited

U.S. PATENT DOCUMENTS

2003/0089314 A1 5/2003 Matsuki et al.
2003/0106490 A1 6/2003 Jallepally et al.
2003/0168001 A1 9/2003 Sneh
2003/0170388 A1 9/2003 Shinriki et al.
2003/0205328 A1 11/2003 Kinnard et al.
2004/0003777 A1 1/2004 Carpenter et al.
2004/0005731 A1 1/2004 Jurgensen et al.
2004/0023461 A1 2/2004 Ahn et al.
2004/0050325 A1 3/2004 Samoilov et al.
2004/0050326 A1 3/2004 Thilderkvist et al.
2004/0050496 A1 3/2004 Iwai et al.
2004/0134611 A1 7/2004 Kato et al.
2004/0149215 A1 8/2004 Shao et al.
2004/0200412 A1 10/2004 Frijlink
2004/0200413 A1 10/2004 Lee
2004/0216665 A1 11/2004 Soininen et al.
2004/0219789 A1 11/2004 Wood et al.
2004/0231799 A1 11/2004 Lee et al.
2004/0235299 A1 11/2004 Srivastava et al.
2004/0238123 A1 12/2004 Becknell et al.
2004/0261712 A1 12/2004 Hayashi et al.
2005/0000423 A1 1/2005 Kasai et al.
2005/0000442 A1 1/2005 Hayashi et al.
2005/0003600 A1* 1/2005 Kasai ................ C23C 16/45521 257/E21.585
2005/0011447 A1 1/2005 Fink
2005/0017100 A1 1/2005 Watanabe et al.
2005/0022739 A1 2/2005 Carpenter et al.
2005/0022748 A1 2/2005 Gabriel et al.
2005/0103748 A1 5/2005 Yamaguchi et al.
2005/0145338 A1 7/2005 Park et al.
2005/0173404 A1 8/2005 Benjamin et al.
2005/0173569 A1 8/2005 Noorbakhsh et al.
2005/0181617 A1 8/2005 Bosch
2005/0205110 A1 9/2005 Kao et al.
2005/0218507 A1 10/2005 Kao et al.
2005/0221552 A1 10/2005 Kao et al.
2005/0230350 A1 10/2005 Kao et al.
2005/0241765 A1 11/2005 Dhindsa et al.
2005/0241766 A1 11/2005 Dhindsa et al.
2005/0242061 A1 11/2005 Fukuda
2005/0284372 A1 12/2005 Murugesh et al.
2006/0005767 A1 1/2006 Tsai et al.
2006/0021701 A1 2/2006 Tobe et al.
2006/0042545 A1 3/2006 Shibata et al.
2006/0046470 A1 3/2006 Becknell et al.
2006/0060138 A1 3/2006 Keller et al.
2006/0112876 A1 6/2006 Choi et al.
2006/0137607 A1 6/2006 Seo et al.
2006/0219361 A1 10/2006 Wang et al.
2007/0044716 A1 3/2007 Tetsuka et al.
2007/0116872 A1 5/2007 Li et al.
2007/0116873 A1 5/2007 Li et al.
2007/0119371 A1 5/2007 Ma et al.
2007/0128862 A1 6/2007 Ma et al.
2007/0128863 A1 6/2007 Ma et al.
2007/0128864 A1 6/2007 Ma et al.
2007/0145021 A1 6/2007 Wang et al.
2007/0157683 A1 7/2007 Li
2007/0212484 A1 9/2007 Li
2007/0246163 A1 10/2007 Paterson et al.
2007/0248515 A1 10/2007 Tompa et al.
2007/0275569 A1 11/2007 Moghadam et al.
2007/0286967 A1 12/2007 Ide et al.
2008/0006204 A1 1/2008 Rusinko et al.
2008/0006208 A1 1/2008 Ueno et al.
2008/0016684 A1 1/2008 Olechnowicz et al.
2008/0053614 A1 3/2008 Sago et al.
2008/0081124 A1 4/2008 Sano et al.
2008/0085226 A1 4/2008 Fondurulia et al.
2008/0093341 A1 4/2008 Turlot et al.
2008/0099145 A1 5/2008 Keller
2008/0141941 A1 6/2008 Augustino et al.
2008/0241379 A1 10/2008 Suzuki et al.
2008/0241517 A1 10/2008 Kenworthy et al.
2008/0242085 A1 10/2008 Fischer et al.
2008/0299326 A1 12/2008 Fukazawa et al.
2008/0308228 A1 12/2008 Stevenson et al.
2008/0317973 A1 12/2008 White et al.
2009/0000743 A1 1/2009 Iizuka
2009/0017227 A1 1/2009 Fu et al.
2009/0081878 A1 3/2009 Dhindsa
2009/0095218 A1 4/2009 Meinhold et al.
2009/0095219 A1 4/2009 Meinhold et al.
2009/0095220 A1 4/2009 Meinhold et al.
2009/0095621 A1 4/2009 Kao et al.
2009/0211085 A1 8/2009 Kennedy et al.
2009/0260571 A1 10/2009 Ostrowski et al.
2009/0305509 A1 12/2009 Stevenson et al.
2010/0163187 A1 7/2010 Yokogawa et al.
2010/0167551 A1 7/2010 DeDontney
2010/0184298 A1 7/2010 Dhindsa
2010/0206376 A1 8/2010 You et al.
2010/0213162 A1 8/2010 Mochiki et al.
2010/0230387 A1 9/2010 Okesaku et al.
2010/0261354 A1 10/2010 Bettencourt et al.
2010/0263588 A1 10/2010 Zhiyin
2010/0272895 A1 10/2010 Tsuda
2010/0276084 A1 11/2010 Yao
2010/0279008 A1 11/2010 Takagi
2010/0288439 A1 11/2010 Ishibashi et al.
2011/0011338 A1 1/2011 Chuc et al.
2011/0048642 A1 3/2011 Mihara et al.
2011/0052833 A1 3/2011 Hanawa et al.
2011/0076401 A1 3/2011 Chao et al.
2011/0146571 A1 6/2011 Bartlett et al.
2011/0159690 A1 6/2011 Chandrashekar et al.
2011/0256645 A1 10/2011 Tam et al.
2011/0256726 A1 10/2011 LaVoie et al.
2011/0281376 A1 11/2011 Amano
2011/0282484 A1 11/2011 Amano
2011/0300716 A1 12/2011 Park et al.
2012/0031559 A1 2/2012 Dhindsa et al.
2012/0070996 A1 3/2012 Hao
2012/0077349 A1 3/2012 Li et al.
2012/0090691 A1 4/2012 Baluja et al.
2012/0103264 A1 5/2012 Choi et al.
2012/0156877 A1 6/2012 Yap et al.
2012/0156880 A1 6/2012 Panagopoulos
2012/0174866 A1 7/2012 Huh et al.
2012/0222815 A1 9/2012 Sabri et al.
2012/0227665 A1 9/2012 Ozgun et al.
2012/0264051 A1 10/2012 Angelov et al.
2012/0269968 A1 10/2012 Rayner, Jr.
2012/0305190 A1 12/2012 Kang et al.
2012/0309204 A1 12/2012 Kang et al.
2013/0034967 A1 2/2013 Bettencourt et al.
2013/0220975 A1 8/2013 Dhindsa
2013/0299605 A1 11/2013 Ehrlich et al.
2013/0306758 A1 11/2013 Park et al.
2013/0341433 A1 12/2013 Roy et al.
2014/0026926 A1 1/2014 Semmelrock et al.
2014/0061324 A1 3/2014 Mohn et al.
2014/0090599 A1 4/2014 Saitou
2014/0097270 A1 4/2014 Liang et al.
2014/0103145 A1 4/2014 White et al.
2014/0103806 A1 4/2014 Kellogg et al.
2014/0158792 A1 6/2014 Meinhold et al.
2014/0179114 A1 6/2014 Van Schravendijk
2014/0235069 A1 8/2014 Breiling et al.
2014/0238608 A1* 8/2014 Sabri ..................... C23C 16/509 239/548
2014/0239091 A1* 8/2014 Huang .............. C23C 16/45572 239/128
2014/0299681 A1 10/2014 Kashyap et al.
2014/0306027 A1 10/2014 Xu et al.
2015/0004798 A1 1/2015 Chandrasekharan et al.
2015/0007770 A1 1/2015 Chandrasekharan et al.
2015/0011095 A1 1/2015 Chandrasekharan et al.
2015/0011096 A1 1/2015 Chandrasekharan et al.
2015/0187568 A1 7/2015 Pettinger et al.
2015/0214009 A1 7/2015 Glukhoy
2015/0218701 A1* 8/2015 Bartlett ............... C23C 16/4401 118/667

(56) References Cited

U.S. PATENT DOCUMENTS

| | | | |
|---|---|---|---|
| 2015/0240361 | A1 | 8/2015 | Madrigal et al. |
| 2015/0315706 | A1 | 11/2015 | Chandrasekharan et al. |
| 2015/0377481 | A1 | 12/2015 | Smith et al. |
| 2016/0079036 | A1 | 3/2016 | Kang et al. |
| 2016/0177466 | A1 | 6/2016 | Kagajawala et al. |
| 2016/0296981 | A1 | 10/2016 | Baluja et al. |
| 2016/0340781 | A1 | 11/2016 | Thomas et al. |
| 2016/0340782 | A1 | 11/2016 | Chandrasekharan et al. |
| 2016/0343595 | A1 | 11/2016 | Lind et al. |
| 2016/0348242 | A1 | 12/2016 | Sung et al. |
| 2016/0348244 | A1 | 12/2016 | Sabri et al. |
| 2017/0009344 | A1 | 1/2017 | Meinhold et al. |
| 2017/0021317 | A1 | 1/2017 | Shareef et al. |
| 2017/0167024 | A1 | 6/2017 | Wiltse et al. |
| 2017/0191160 | A1* | 7/2017 | Wiltse ............... C23C 16/45589 |
| 2017/0260627 | A1 | 9/2017 | Breiling et al. |
| 2017/0301515 | A1 | 10/2017 | Madsen et al. |
| 2018/0012733 | A1 | 1/2018 | Phillips et al. |
| 2018/0057940 | A1 | 3/2018 | Madsen et al. |
| 2018/0068833 | A1 | 3/2018 | Kang et al. |
| 2018/0130652 | A1 | 5/2018 | Pettinger et al. |
| 2018/0142352 | A1* | 5/2018 | Shah ................ C23C 16/45572 |
| 2018/0197758 | A1 | 7/2018 | Parkhe |
| 2018/0294144 | A1 | 10/2018 | Aubuchon et al. |
| 2018/0337075 | A1* | 11/2018 | Iu ........................ C23C 16/4583 |
| 2018/0340256 | A1 | 11/2018 | Sung et al. |
| 2019/0066985 | A1* | 2/2019 | Hirose ................ H01L 21/6831 |
| 2019/0211451 | A1 | 7/2019 | Madsen et al. |
| 2019/0256977 | A1 | 8/2019 | Meinhold et al. |
| 2019/0352777 | A1 | 11/2019 | Shankar et al. |
| 2020/0087789 | A1 | 3/2020 | Mustafa et al. |
| 2020/0312638 | A1 | 10/2020 | Leonard, III et al. |
| 2020/0321193 | A1 | 10/2020 | Ni et al. |
| 2021/0187521 | A1 | 6/2021 | Mustafa et al. |
| 2021/0214846 | A1 | 7/2021 | Nandwana et al. |
| 2021/0265134 | A1 | 8/2021 | Singh et al. |
| 2021/0404064 | A1 | 12/2021 | Dip |
| 2022/0051873 | A1 | 2/2022 | Kim et al. |
| 2022/0290300 | A1 | 9/2022 | Vellanki et al. |
| 2022/0316066 | A1 | 10/2022 | Santiago et al. |
| 2023/0008986 | A1 | 1/2023 | Iyengar et al. |
| 2023/0044064 | A1 | 2/2023 | Luo et al. |
| 2023/0268179 | A1 | 8/2023 | Tomczak et al. |
| 2023/0374660 | A1 | 11/2023 | Singh et al. |
| 2024/0222115 | A1 | 7/2024 | Niskanen |
| 2025/0006515 | A1 | 1/2025 | Miller et al. |
| 2025/0054734 | A1 | 2/2025 | Luo et al. |
| 2025/0115998 | A1 | 4/2025 | Vellanki et al. |

FOREIGN PATENT DOCUMENTS

| | | | |
|---|---|---|---|
| CN | 1802722 | A | 7/2006 |
| CN | 2893917 | Y | 4/2007 |
| CN | 101003895 | A | 7/2007 |
| CN | 101101887 | A | 1/2008 |
| CN | 101290869 | A | 10/2008 |
| CN | 100487857 | C | 5/2009 |
| CN | 101448977 | A | 6/2009 |
| CN | 101556904 | A | 10/2009 |
| CN | 201343570 | Y | 11/2009 |
| CN | 100567563 | C | 12/2009 |
| CN | 101755325 | A | 6/2010 |
| CN | 101916715 | A | 12/2010 |
| CN | 102102194 | A | 6/2011 |
| CN | 102132383 | A | 7/2011 |
| CN | 202025711 | U | 11/2011 |
| CN | 103403843 | A | 11/2013 |
| CN | 103521956 | A | 1/2014 |
| CN | 103890911 | A | 6/2014 |
| CN | 104278254 | A | 1/2015 |
| CN | 106167895 | A | 11/2016 |
| CN | 106191814 | B | 10/2018 |
| CN | 109983566 | A | 7/2019 |
| CN | 215815786 | U | 2/2022 |
| EP | 0462730 | A1 | 12/1991 |
| EP | 1568797 | A2 | 8/2005 |
| JP | S6187319 | A | 5/1986 |
| JP | H0745542 | A | 2/1995 |
| JP | H07240404 | A | 9/1995 |
| JP | H09120988 | A | 5/1997 |
| JP | H1050678 | A | 2/1998 |
| JP | 2000183029 | A | 6/2000 |
| JP | 2000290777 | A | 10/2000 |
| JP | 2001185491 | A | 7/2001 |
| JP | 2001274103 | A | 10/2001 |
| JP | 2001525495 | A | 12/2001 |
| JP | 2002033311 | A | 1/2002 |
| JP | 2002503765 | A | 2/2002 |
| JP | 2002069650 | A | 3/2002 |
| JP | 2003504842 | A | 2/2003 |
| JP | 2003203908 | A | 7/2003 |
| JP | 2004115837 | A | 4/2004 |
| JP | 2004356587 | A | 12/2004 |
| JP | 2005123159 | A | 5/2005 |
| JP | 2005285846 | A | 10/2005 |
| JP | 2007059567 | A | 3/2007 |
| JP | 2007535824 | A | 12/2007 |
| JP | 2008047869 | A | 2/2008 |
| JP | 3147392 | | 12/2008 |
| JP | 2009004713 | A | 1/2009 |
| JP | 2009021592 | A | 1/2009 |
| JP | 2010033867 | A | 2/2010 |
| JP | 2010150575 | A | 7/2010 |
| JP | 2010153680 | A | 7/2010 |
| JP | 5468735 | B2 | 4/2014 |
| JP | 2014070249 | A | 4/2014 |
| JP | 2014074190 | A | 4/2014 |
| JP | 2014509783 | A | 4/2014 |
| JP | 2014078685 | A | 5/2014 |
| JP | 2014143101 | A | 8/2014 |
| JP | 2015002349 | A | 1/2015 |
| JP | 2016219803 | A | 12/2016 |
| KR | 20000071576 | A | 11/2000 |
| KR | 20010076368 | A | 8/2001 |
| KR | 20010098812 | A | 11/2001 |
| KR | 100319468 | B1 | 4/2002 |
| KR | 20050087405 | A | 8/2005 |
| KR | 20060017806 | A | 2/2006 |
| KR | 20060042113 | A | 5/2006 |
| KR | 100587628 | B1 | 6/2006 |
| KR | 20060100961 | A | 9/2006 |
| KR | 100667714 | B1 | 1/2007 |
| KR | 20070002218 | A | 1/2007 |
| KR | 20070026210 | A | 3/2007 |
| KR | 20070095806 | A | 10/2007 |
| KR | 20080025277 | A | 3/2008 |
| KR | 20080075198 | A | 8/2008 |
| KR | 20090003703 | U | 4/2009 |
| KR | 20090041488 | A | 4/2009 |
| KR | 100936059 | B1 | 1/2010 |
| KR | 20100058446 | A | 6/2010 |
| KR | 20100093347 | A | 8/2010 |
| KR | 20100010304 | U | 10/2010 |
| KR | 20100134215 | A | 12/2010 |
| KR | 20110028989 | A | 3/2011 |
| KR | 200454281 | Y1 | 6/2011 |
| KR | 20110138730 | A | 12/2011 |
| KR | 20110139079 | A | 12/2011 |
| KR | 20130055582 | A | 5/2013 |
| KR | 20130141358 | A | 12/2013 |
| KR | 20140000653 | A | 1/2014 |
| KR | 20140011364 | A | 1/2014 |
| KR | 20140016196 | A | 2/2014 |
| KR | 20140038902 | A | 3/2014 |
| KR | 20140042699 | A | 4/2014 |
| KR | 20140145095 | A | 12/2014 |
| KR | 101745074 | B1 | 6/2017 |
| KR | 20200060579 | A | 6/2020 |
| KR | 102333103 | B1 | 11/2021 |
| KR | 102357417 | B1 | 1/2022 |
| KR | 20220049926 | A | 4/2022 |
| KR | 20230069200 | A | 5/2023 |
| SG | 152163 | A1 | 5/2009 |
| SG | 10201503253 | | 12/2015 |

(56) References Cited

FOREIGN PATENT DOCUMENTS

| | | | |
|---|---|---|---|
| TW | 300319 | B | 3/1997 |
| TW | 200610033 | A | 3/2006 |
| TW | 200902751 | A | 1/2009 |
| TW | 200923126 | A | 6/2009 |
| TW | 200924049 | A | 6/2009 |
| TW | M361710 | U | 7/2009 |
| TW | 201132793 | A | 10/2011 |
| TW | 201411761 | A | 3/2014 |
| TW | 201413042 | A | 4/2014 |
| TW | 201502310 | A | 1/2015 |
| TW | 201509537 | A | 3/2015 |
| TW | 201903200 | A | 1/2019 |
| WO | WO-0042236 | A2 | 7/2000 |
| WO | WO-2004107413 | A2 | 12/2004 |
| WO | WO-2005103323 | A1 | 11/2005 |
| WO | WO-2006022997 | A2 | 3/2006 |
| WO | WO-2007060143 | A1 | 5/2007 |
| WO | WO-2007142690 | A2 | 12/2007 |
| WO | WO-2008042032 | A1 | 4/2008 |
| WO | WO-2009055244 | A1 | 4/2009 |
| WO | WO-2009089794 | A1 | 7/2009 |
| WO | WO-2012036856 | A2 | 3/2012 |
| WO | WO-2012122054 | A2 | 9/2012 |
| WO | WO-2012166362 | A1 | 12/2012 |
| WO | WO-2019022978 | A1 | 1/2019 |
| WO | WO-2020159708 | A1 | 8/2020 |
| WO | WO-2021127287 | A1 | 6/2021 |
| WO | WO-2022060615 | A1 | 3/2022 |
| WO | WO-2022119732 | A1 | 6/2022 |

OTHER PUBLICATIONS

Chinese First Office Action dated Apr. 10, 2018 issued in Application No. CN 201610361563.2.
Chinese First Office Action, dated Apr. 19, 2017, issued in Application No. CN 201510221479.6.
Chinese First Office Action, dated Aug. 2, 2018 issued in Application No. CN 201611008058.6.
Chinese First Office Action, dated Aug. 4, 2015, issued in Application No. CN 201280011733.4.
Chinese First Office Action, dated Feb. 8, 2014, issued in Application No. CN 201010602102.2.
Chinese First Office Action dated Jun. 18, 2020 issued in Application No. CN 201811101686.8.
Chinese First Office Action, dated May 17, 2018, issued in Application No. CN 201610345779.X.
Chinese Office Action, dated May 12, 2009, issued in Application No. CN 200820135478.5.
Chinese Second Office Action dated Apr. 10, 2019, issued in Application No. CN 201610345779.X.
Chinese Second Office Action, dated Aug. 29, 2014, issued in Application No. CN 201010602102.2.
Chinese Second Office Action dated Feb. 22, 2021 issued in Application No. CN 201811101686.8.
Chinese Second Office Action, dated May 24, 2016, issued in Application No. CN 201280011733.4.
Chinese Second Office Action, dated Nov. 16, 2017, issued in Application No. CN 201510221479.6.
Chinese Third Office Action dated Aug. 2, 2021 issued in Application No. CN 201811101686.8.
Chinese Third Office Action, dated May 15, 2018, issued in Application No. CN 201510221479.6.
Chinese Third Office Action, dated Sep. 25, 2019, issued in Application No. CN 201610345779.X.
Coburn et al., (Dec. 1972) "Postive-ion bombardment of substrates in rf diode glow discharge sputtering," Journal of Applied Physics, 43(12):4965-4971.
International Preliminary Report on Patentability dated Mar. 10, 2022, in Application No. PCT/US2020/070434.
International Preliminary Report on Patentability dated Mar. 3, 2022, in Application No. PCT/US2020/070437.
International Search Report and Written Opinion dated Dec. 15, 2020, in Application No. PCT/US2020/070437.
International Search Report and Written Opinion dated Nov. 11, 2020 issued in Application No. PCT/US2020/070434.
Japanese First Office Action, dated Aug. 18, 2020, issued in Application No. JP 2016-098409.
Japanese Office Action, dated Mar. 19, 2019, issued in Application No. JP 2015-090931.
Japanese Office Action, dated Sep. 15, 2015, issued in Application No. JP 2013-556661.
Japanese Second Office Action, dated Dec. 22, 2020, issued in Application No. JP 2016-098409.
Japanese Second Office Action, dated Nov. 26, 2019, issued in Application No. JP 2015-090931.
Japanese Third Office Action, dated Jul. 7, 2020, issued in Application No. JP 2015-090931.
Köhler et al., (Jan. 1, 1985) "Plasma potentials of 13.56-MHz rf argon glow discharges in a planar system," Journal of Applied Physics 57(1):59-66.
Koenig et al., (Mar. 1970) "Application of RF Discharges to Sputtering," IBM Journal of Research Development, pp. 168-171.
Korean Decision for Grant dated Aug. 25, 2021, issued in Application No. KR 10-2015-0062683.
Korean Decision for Grant dated Oct. 25, 2021, issued in Application No. KR 10-2016-0061452.
Korean First Office Action dated Apr. 26, 2021, issued in Application No. KR 10-2016-0061452.
Korean First Office Action, dated Dec. 12, 2016, issued in Application No. KR 2010-0129965.
Korean First Office Action, dated Mar. 21, 2021, issued in Application No. KR 10-2015-0062683.
Korean Office Action, dated Apr. 30, 2018, issued in Application No. KR 10-2018-7008297.
Korean Office Action, dated Dec. 31, 2010, issued in Application No. KR 2008-0013796.
Korean Office Action, dated May 23, 2017, issued in Application No. KR 10-2013-7026302.
Korean Second Office Action dated Aug. 25, 2021, issued in Application No. KR 10-2016-0061452.
KR Office Action dated Feb. 7, 2022, in Application No. KR1020210164496 with English translation.
Maniv, (Feb. 15, 1988) "Modeling for rf discharge characteristics," Journal of Applied Physics, 63(4):1022-1031.
Mohamed Sabri et al., "Ceramic Showerhead with Embedded RF Electrode for Capacitively Coupled Plasma Reactor," filed Feb. 28, 2013, pp. 1-37.
Novellus, XL*, High Vacuum Angle Valve, Air Operated, Lam Research, DOC-3076a, Document Control Released Oct. 25, 2012, 5 pages.
PCT International Preliminary Report on Patentability and Written Opinion dated Apr. 7, 2009, issued in PCT/US2007/015979.
PCT International Report on Patentability dated Sep. 19, 2013 issued in PCT/US2012/027596.
PCT International Search Report and Written Opinion dated Jan. 10, 2008, issued in PCT/US2007/015979.
PCT International Search Report and Written Opinion dated Sep. 27, 2012 issued in PCT/US2012/027596.
SG Search and Examination Report, dated May 3, 2010, issued in Application No. SG 2008/07575-6.
Singapore Notice of Eligibility for Grant dated Jan. 20, 2021, issued in Sg 10201604054P.
Singapore Search and Examination Report, dated Mar. 5, 2012, issued in Application No. SG 201009408-4.
Taiwan First Office Action dated Feb. 27, 2019, issued in Application No. TW 104114093.
Taiwan Notice of Allowance and Search Report, dated Dec. 12, 2017, issued in Application No. TW 105137645.
Taiwan Office Action, dated Dec. 4, 2015, issued in Application No. TW 101107246.
Taiwan Office Action, dated Mar. 26, 2015, issued in Application No. TW 099144608.
Taiwan Office Action, dated May 17, 2016, issued in Application No. TW104138639.

(56) References Cited

OTHER PUBLICATIONS

Taiwanese First Office Action dated Aug. 7, 2019 issued in Application No. TW 105116200.
Taiwanese Notice of Allowance dated Aug. 21, 2020, issued in TW 105115413.
U.S. Applicant Initiated Interview Summary, dated Nov. 1, 2017, issued in U.S. Appl. No. 14/668,511.
U.S. Examiner's Answer, dated Dec. 21, 2011, issued in U.S. Appl. No. 12/181,927.
U.S. Final Office Action, dated Apr. 8, 2013, issued in U.S. Appl. No. 12/642,497.
U.S. Final Office Action dated Dec. 17, 2018, issued in U.S. Appl. No. 15/234,940.
U.S. Final Office Action, dated Feb. 19, 2016, issued in U.S. Appl. No. 13/411,369.
U.S. Final Office Action, dated Feb. 7, 2018, issued in U.S. Appl. No. 14/668,511.
U.S. Final Office Action, dated Jan. 30, 2012, issued in U.S. Appl. No. 12/148,267.
U.S. Final Office Action, dated Jul. 20, 2017, issued in U.S. Appl. No. 14/687,134.
US Final Office Action, dated Jul. 21, 2011, issued in U.S. Appl. No. 11/542,959.
US Final Office Action, dated Mar. 21, 2011, issued in U.S. Appl. No. 11/974,945.
US Final Office Action, dated Mar. 21, 2011, issued in U.S. Appl. No. 11/974,966.
U.S. Final Office Action, dated Mar. 28, 2011, issued in U.S. Appl. No. 12/181,927.
U.S. Final Office Action dated May 18, 2018, issued in U.S. Appl. No. 14/716,823.
U.S. Final Office Action, dated Nov. 6, 2013, issued in U.S. Appl. No. 12/642,497.
U.S. Final Office Action dated Oct. 18, 2018 issued in U.S. Appl. No. 14/850,816.
US Final Office Action, dated Oct. 28, 2010, issued in U.S. Appl. No. 11/542,959.
U.S. Miscellaneous Communication, dated Jul. 11, 2016, issued in U.S. Appl. No. 14/169,325.
U.S. Notice of Allowance dated Apr. 13, 2020 issued in U.S. Appl. No. 14/668,511.
U.S. Notice of Allowance dated Apr. 23, 2019, issued in U.S. Appl. No. 15/234,940.
U.S. Notice of Allowance, dated Jan. 15, 2015, issued in U.S. Appl. No. 12/642,497.
U.S. Notice of Allowance, dated Jan. 6, 2012, issued in U.S. Appl. No. 11/974,966.
US Notice of Allowance dated Jul. 30, 2019 issued in U.S. Appl. No. 16/035,491.
U.S. Notice of Allowance dated Jun. 18, 2019 issued in U.S. Appl. No. 14/668,511.
U.S. Notice of Allowance, dated Jun. 22, 2016, issued in U.S. Appl. No. 14/169,325.
U.S. Notice of Allowance dated Mar. 21, 2019 issued in U.S. Appl. No. 14/850,816.
US Notice of allowance dated Mar. 22, 2019 issued in U.S. Appl. No. 16/035,491.
US Notice of Allowance dated Mar. 8, 2018, issued in U.S. Appl. No. 15/163,594.
U.S. Notice of Allowance, dated May 2, 2016, issued in U.S. Appl. No. 13/411,369.
U.S. Notice of Allowance dated Oct. 15, 2019, issued in U.S. Appl. No. 16/291,822.
U.S. Notice of Allowance dated Oct. 19, 2018, issued in U.S. Appl. No. 15/275,060.
U.S. Notice of Allowance, dated Oct. 25, 2013, issued in U.S. Appl. No. 12/181,927.
US Office Action, dated Apr. 21, 2010, issued in U.S. Appl. No. 11/542,959.
U.S. Office Action, dated Apr. 4, 2018, issued in U.S. Appl. No. 14/850,816.
U.S. Office Action, dated Aug. 17, 2011, issued in U.S. Appl. No. 12/148,267.
US Office Action, dated Feb. 16, 2011, issued in U.S. Appl. No. 11/542,959.
U.S. Office Action, dated Jul. 12, 2013, issued in U.S. Appl. No. 12/642,497.
U.S. Office Action, dated Jul. 27, 2017, issued in U.S. Appl. No. 14/668,511.
U.S. Office Action dated Jul. 27, 2018, issued in U.S. Appl. No. 15/234,940.
U.S. Office Action dated Jun. 15, 2018, issued in U.S. Appl. No. 15/275,060.
U.S. Office Action, dated Mar. 11, 2016, issued in U.S. Appl. No. 14/169,325.
U.S. Office Action, dated May 3, 2017, issued in U.S. Appl. No. 14/687,134.
US Office Action dated Nov. 28, 2018, issued in U.S. Appl. No. 16/035,491.
U.S. Office Action dated Nov. 29, 2018 issued in U.S. Appl. No. 14/668,511.
U.S. Office Action, dated Nov. 8, 2012, issued in U.S. Appl. No. 12/642,497.
U.S. Office Action dated Oct. 3, 2019 issued in U.S. Appl. No. 14/668,511.
U.S. Office Action, dated Sep. 14, 2017, issued in U.S. Appl. No. 14/716,823.
U.S. Office Action, dated Sep. 17, 2010, issued in U.S. Appl. No. 11/974,945.
U.S. Office Action, dated Sep. 17, 2010, issued in U.S. Appl. No. 11/974,966.
U.S. Office Action, dated Sep. 17, 2010, issued in U.S. Appl. No. 12/181,927.
U.S. Office Action, dated Sep. 2, 2011, issued in U.S. Appl. No. 11/974,966.
U.S. Office Action, dated Sep. 24, 2014, issued in U.S. Appl. No. 12/642,497.
U.S. Office Action, dated Sep. 28, 2015, issued in U.S. Appl. No. 13/411,369.
U.S. Office Action Interview Summary dated Jul. 18, 2018, issued in U.S. Appl. No. 14/716,823.
U.S. Office Action Interview Summary, dated May 23, 2018, issued in U.S. Appl. No. 14/668,511.
U.S. Appl. No. 17/638,599, Inventors Vellanki et al., filed on Feb. 25, 2022.
U.S. Patent Board Decision on Appeal dated Aug. 19, 2013 issued in U.S. Appl. No. 12/181,927.
CN Office Action dated Dec. 28, 2023 in CN Application No. 202080075633.2, with English Translation.
CN Office Action dated Nov. 30, 2023 in CN Application No. 202080059762.2 with English translation.
Cooling Plate Assembly sold by Applicant prior to Aug. 23, 2018, 4 pages.
International Preliminary Report on Patentability and written opinion dated Jul. 21, 2022 in Application WO2020US64372.
International Search Report and Written Opinion dated Dec. 3, 2024 in PCT Application No. PCT/US2024/042531.
International Search Report and Written Opinion dated Jan. 2, 2024 in PCT Application No. PCT/US2023/074154.
International Search Report and Written Opinion dated Jan. 16, 2024 in PCT Application No. PCT/US2023/033446.
International Search Report and Written Opinion dated Mar. 29, 2021 issued in Application No. PCT/US2020/064372.
International Search Report and Written Opinion dated Sep. 20, 2023 in PCT Application No. PCT/US2023/021927.
JP Office Action dated Aug. 27, 2024 in JP Application No. 2022-541607 with English translation.
JP Office Action dated Jun. 7, 2022, in Application No. JP2021-071508 with English translation.
JP Office Action dated Oct. 13, 2022, in Application No. JP2021-071508 with English translation.

(56) References Cited

OTHER PUBLICATIONS

KR Notice of Allowance dated Jan. 7, 2025 in KR Application No. 10-2023-0151477, with English Translation.
KR Notice of Allowances dated Oct. 29, 2024 in KR Application No. 10-2023-0124456 with English Translation.
KR Office Action dated Aug. 23, 2024 in KR Application No. 10-2023-0119513, with English Translation.
KR Office Action dated Aug. 26, 2022 in Application No. KR20210164496 with English translation.
KR Office Action dated Feb. 23, 2023, in Application No. KR10-2021-0164496 with English translation.
KR Office Action dated Jan. 17, 2024 in KR Application No. 10-2023-0119513, with English Translation.
KR Office Action dated Jan. 18, 2024 in KR Application No. 10-2023-0151477, with English Translation.
KR Office Action dated Jan. 30, 2024 in KR Application No. 10-2023-0124456, with English Translation.
KR Office Action dated Jul. 29, 2024 in KR Application No. 10-2023-0151477, with English Translation.
KR Office Action dated Jun. 19, 2023, in application No. KR20210164496 with English translation.
KR Office Action dated May 30, 2023 in Application No. KR10-2022-0011054 with English translation.
KR Office Action dated Nov. 9, 2022 in Application No. KR10-2022-0011054 with English translation.
KR Prior Art Search Report dated Nov. 13, 2023 in Application No. KR 10-2023-0151477, with English translation.
KR Prior-Art Search Report dated Sep. 15, 2023, in application No. KR 10-2023-0119513, with English translation.
SG Search Report and Written Opinion dated Jul. 30, 2024 in SG Application No. 10202102836Y.
SG Supplementary Examination Report dated Dec. 4, 2023 in SG Application No. 10201602599X.
TW Office Action dated Oct. 14, 2024 in TW Application No. 110100013 with English translation.
U.S. Notice of Allowance dated Oct. 1, 2024 in U.S. Appl. No. 17/638,599.
U.S. Notice of Allowance dated Sep. 18, 2024 in U.S. Appl. No. 17/638,599.
U.S. Appl. No. 17/758,341, inventors Luo et al., Filed on Jul. 1, 2022.
U.S. Appl. No. 18/985,663, inventors Vellanki R et al., filed on Dec. 18, 2024.
U.S. Supplemental Notice of Allowance dated Dec. 23, 2024 in U.S. Appl. No. 17/638,599.
KR Office Action dated Jun. 19, 2025 in KR Application No. 10-2022-7009580, with English Translation.
International Search Report and Written Opinion dated Apr. 29, 2025 in PCT Application No. PCT/US2025/011094.
KR Office Action dated Jun. 28, 2025 in KR Application No. 10-2022-7010118, with English Translation.
TW Office Action dated May 22, 2025 in TW Application No. 110100013, with English Translation.
International Preliminary Report on Patentability and Written Opinion dated Apr. 3, 2025 in PCT Application No. PCT/US2023/033446.
International Preliminary Report on Patentability and Written Opinion dated Mar. 27, 2025 in PCT Application No. PCT/US2023/074154.
International Search Report and Written Opinion dated Feb. 5, 2025 in PCT Application No. PCT/US2024/052601.
Invitation to Amend dated Mar. 11, 2025 for Application No. 11202251053G.
KR Decision to Grant and Search Report dated Mar. 21, 2025 in KR Application No. 10-2023-0119513, with English translation.
U.S. Non-Final Office Action dated Mar. 27, 2025 in U.S. Appl. No. 17/758,341.
U.S. Appl. No. 19/110,771, inventors Eric Mak J.N et al., filed on Mar. 11, 2025.
U.S. Appl. No. 19/111,319, inventors Huang Z et al., filed on Mar. 13, 2025.

* cited by examiner

THERMALLY CONTROLLED CHANDELIER SHOWERHEAD

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Semiconductor processing tools often include components designed to distribute process gases in a relatively even manner across a semiconductor substrate or wafer. Such components are commonly referred to in the industry as "showerheads." Showerheads typically include a faceplate that fronts a semiconductor processing volume in which semiconductor substrates or wafers may be processed. The faceplate may include a plurality of gas distribution ports that allow gas in the plenum volume to flow through the faceplate and into a reaction space between the substrate and the faceplate (or between a wafer support supporting the wafer and the faceplate). Showerheads are typically classified into broad categories: flush-mount and chandelier-type. Flush-mount showerheads are typically integrated into the lid of a processing chamber, i.e., the showerhead serves as both a showerhead and as the chamber lid. Chandelier-type showerheads do not serve as the lid to the processing chamber, and are instead suspended within their semiconductor processing chambers by stems that serve to connect such showerheads with the lids of such chambers and to provide a fluid flow path or paths for processing gases to be delivered to such showerheads.

SUMMARY

Details of one or more implementations of the subject matter described in this specification are set forth in the accompanying drawings and the description below. Other features, aspects, and advantages will become apparent from the description, the drawings, and the claims.

In some implementations, an apparatus is provided that includes a showerhead. The showerhead may include a faceplate and a backplate, with a gas distribution plenum interposed between the faceplate and the backplate. The showerhead may also include a stem that has a gas inlet, one or more heater elements, and a cooling plate assembly. In such a showerhead, the stem may be supported by the cooling plate assembly and may extend from the cooling plate assembly along a center axis. Additionally, the one or more heater elements may be located at least partially within the stem and may extend at least along a direction parallel to the center axis, the cooling plate assembly may include an inner cooling channel and an outer cooling channel, the outer cooling channel may extend around the inner cooling channel when viewed along the center axis, and the inner and outer cooling channels may both extend around the one or more heater elements when viewed along the center axis.

In some such implementations, a stem base may also be included. The stem base may be interposed between the backplate and the stem, larger in size than the stem when viewed along the center axis, and smaller in size than the backplate when viewed along the center axis.

In some implementations, the stem base may include a plurality of scallops arranged along an outer perimeter of the stem base when viewed along the center axis, the back plate may include a corresponding plurality of weld access holes, and each weld access hole may be collocated with one of the scallops.

In some further implementations, each of the one or more heater elements may extend from the cooling plate assembly to a location in between the gas distribution plenum and the stem base.

In some implementations, there may be at least three heater elements.

In some implementations, the cooling plate assembly may include a first plate and a second plate, a first surface of the first plate may be bonded to a second surface of the second plate, the inner cooling channel may extend into the second surface of the second plate and away from the first surface, and the first plate may include one or more protrusions that extend from the first surface, into one or more corresponding portions of the inner cooling channel, and towards the backplate.

In some implementations, the inner cooling channel may include an inner side wall and an outer side wall, the inner side wall may be encircled by the outer side wall, and the inner side wall may include a first plurality of first convex lobes arranged in a first radial pattern.

In some implementations, each protrusion may include a first concave recess within which is nestled one of the first convex lobes. In some further implementations, the inner side wall may include a second plurality of second convex lobes arranged in a second radial pattern. In some additional implementations, the outer side wall may include a plurality of third convex lobes arranged in a third radial pattern. In yet some further implementations, each first convex lobe may be positioned across the inner cooling channel from a corresponding one of the third convex lobes.

In some implementations, each protrusion may include a second concave recess on a side of the protrusion opposite the first concave recess of the protrusion, and one of the third convex lobes may be nestled within each of the second concave recesses.

In some implementations, each second convex lobe may be circumferentially interposed in between two adjacent third convex lobes.

In some implementations, there may be three protrusions.

In some implementations, a gap may exist between each protrusion and the second plate.

In some implementations, at least a first protrusion of the one or more protrusions may not contact the second plate.

In some implementations, the cooling plate assembly may include a plurality of through-holes, the stem may include a plurality of threaded holes in a top face of the stem, each threaded hole may be aligned with one of the through-holes in the cooling plate assembly, the top face of the stem may be butted up against a bottom face of the cooling plate assembly, a corresponding clamping fastener may be inserted through each through-hole in the cooling plate assembly and threaded into the threaded hole in the stem aligned therewith, counterbores may exist in one or both of the top face of the stem and the bottom face of the cooling plate assembly, and each counterbore may be centered on one of the through-holes through the cooling plate assembly. In some such implementations, the counterbores may be in the top face of the stem. In some further or alternative such implementations, the threaded holes may have threads provided by helical inserts.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

The various implementations disclosed herein are illustrated by way of example, and not by way of limitation, in the figures of the accompanying drawings, in which like reference numerals refer to similar elements.

FIGS. 1 through 15 are drawn to scale within each Figure, although the scale from Figure to Figure may vary.

DETAILED DESCRIPTION

Figure 1:
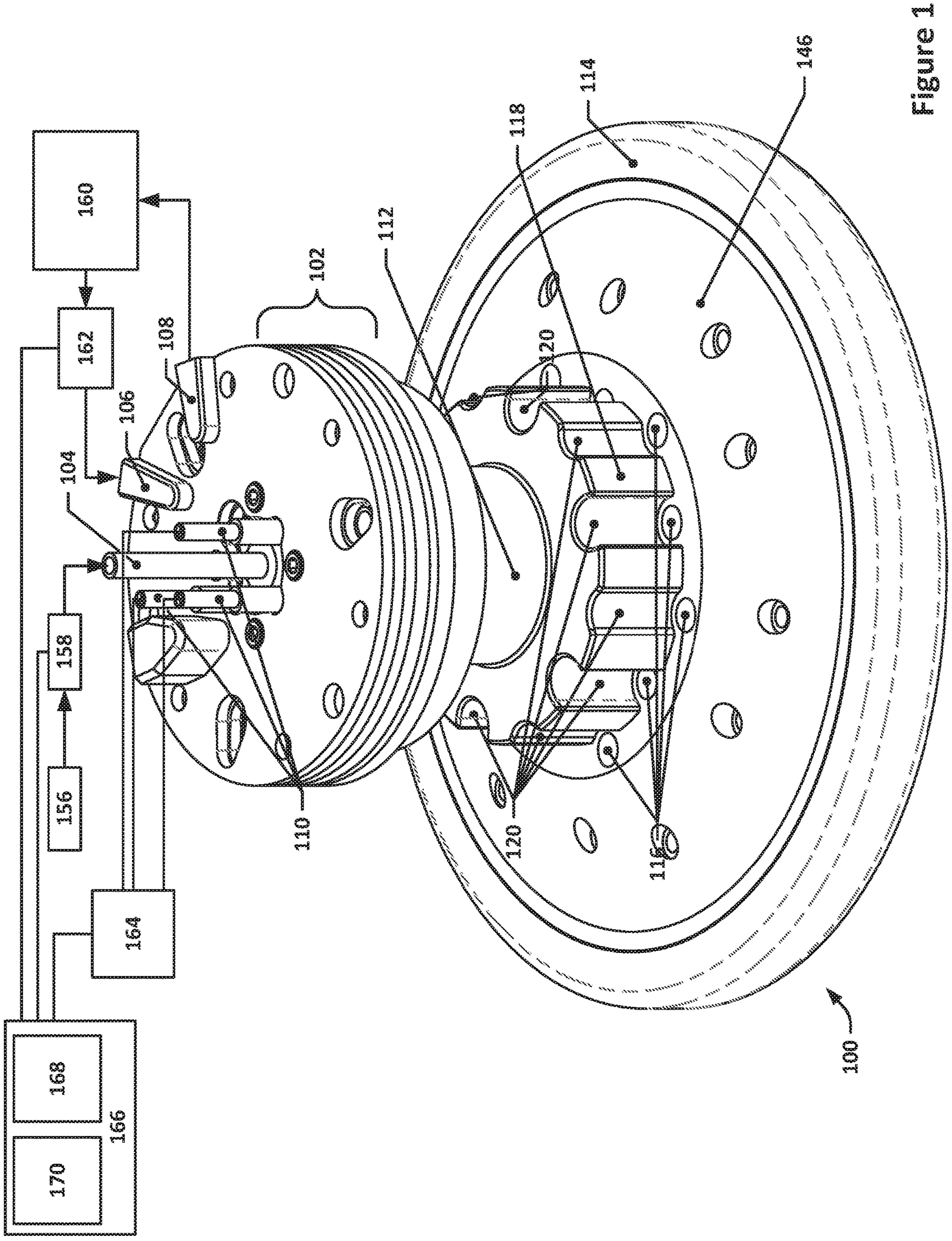
FIG. 1 depicts an isometric view of an example thermally controlled showerhead.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

In this application, the terms "semiconductor wafer," "wafer," "substrate," "wafer substrate," and the like are used interchangeably. A wafer or substrate used in the semiconductor device industry typically has a diameter of 200 mm, 300 mm, or 450 mm, but may also be non-circular and of other dimensions. In addition to semiconductor wafers, other work pieces that may take advantage of this invention include various articles such as printed circuit boards, magnetic recording media, magnetic recording sensors, mirrors, optical elements, micro-mechanical devices and the like.

Several conventions may have been adopted in some of the drawings and discussions in this disclosure. For example, reference is made at various points to "volumes," e.g., "plenum volumes." These volumes may be generally indicated in various Figures, but it is understood that the Figures and the accompanying numerical identifiers represent an approximation of such volumes, and that the actual volumes may extend, for example, to various solid surfaces that bound the volumes. Various smaller volumes, e.g., gas inlets or other holes leading up to a boundary surface of a plenum volume, may be fluidically connected to those plenum volumes.

It is to be understood that the use of relative terms such as "above," "on top," "below," "underneath," etc. are to be understood to refer to spatial relationships of components with respect to the orientations of those components during normal use of a showerhead or with respect to the orientation of the drawings on the page. In normal use, showerheads are typically oriented so as to distribute gases downwards towards a substrate during substrate processing operations.

In some semiconductor processing operations, it may be desirable to heat gas that flows through a showerhead, e.g., to prevent condensation or to ensure that the gas is at an appropriate temperature when introduced to the semiconductor processing chamber via the showerhead. In order to provide for such controlled heating in a chandelier-type showerhead, cartridge heaters may be introduced into holes in the stem of such a chandelier-type showerhead that run parallel to the gas flow passage through the stem. Such cartridge heaters may, depending on the particular requirements of a semiconductor processing operation, reach temperatures of between 500° C. and 800° C.

Showerheads may also receive heat through other mechanisms, e.g., as a result of semiconductor processing operations. For example, in some semiconductor processing operations, the temperature of the pedestal supporting the wafer may reach temperatures of 600° C. to 700° C., e.g., 650° C., and the gas that is introduced into the semiconductor processing chamber may be exposed to high-voltage radio-frequency field to generate a plasma environment that may be several thousand degrees Celsius. Moreover, a trend can be seen that processing temperatures continue to increase as new and improved semiconductor processing operations are develop. The heat from such semiconductor processing operations may be transferred into the showerhead and, along with the heat provided by the cartridge heaters, cause the showerhead to reach temperatures of approximately 300° C. to 360° C., e.g., 350° C. The heat that accumulates in the showerhead may then generally need to be transferred out of the showerhead to avoid overheating; the only conductive path out of such a showerhead is via the stem of that showerhead and through the structure that supports the stem. Radiative and convective heat transfer may also serve to transfer heat out of the showerhead, but the dominant mechanism for heat transfer is conductive heat transfer.

Presented herein are concepts relating to a thermally controlled showerhead that may be used in high-temperature processing to not only deliver gases at elevated temperatures to the showerhead, but to also allow for efficient conduction of excess heat out of the showerhead via the stem.

Figure 2:
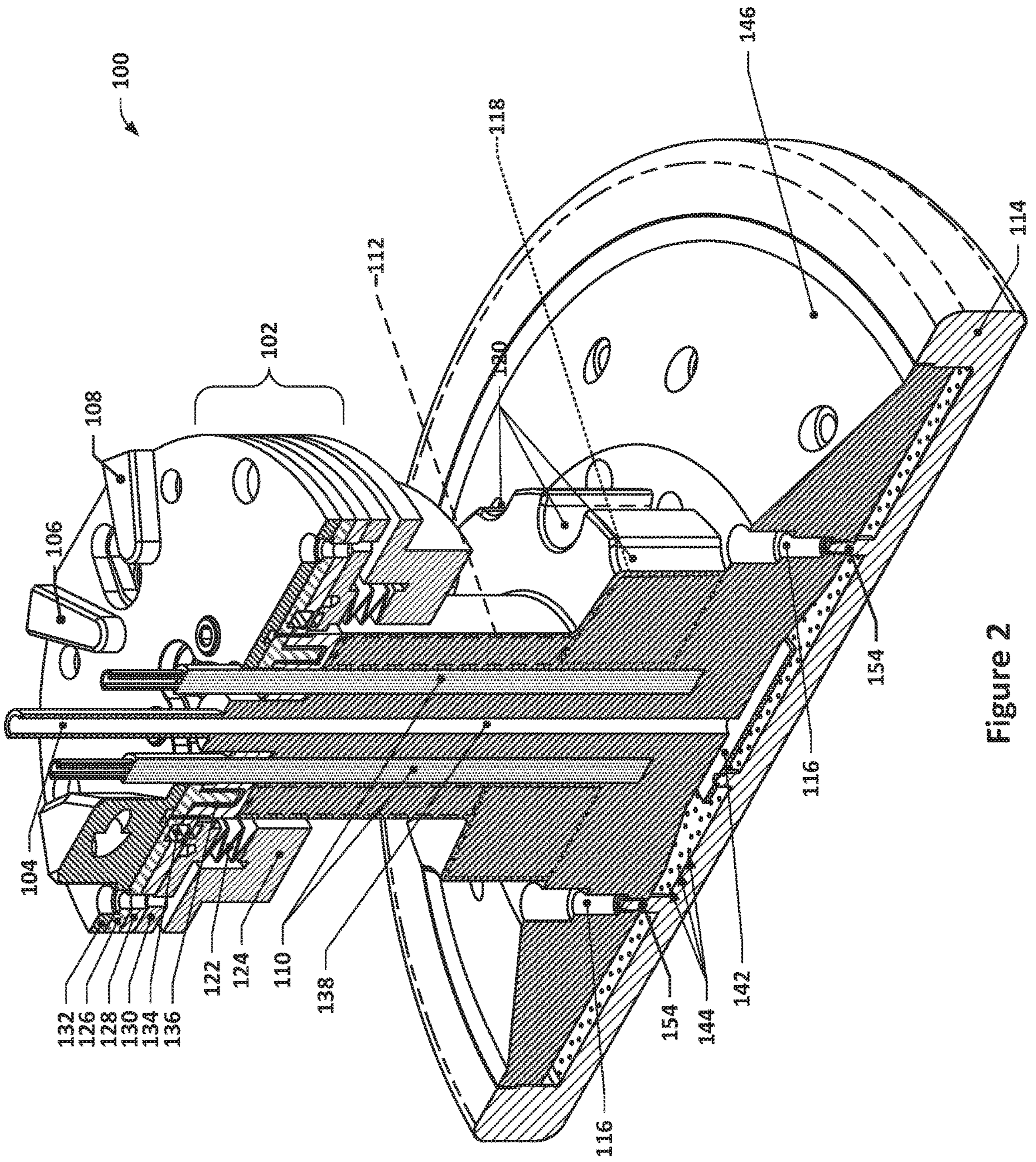
FIG. 2 depicts an isometric cutaway view of the example thermally controlled showerhead of FIG. 1.

FIG. 1 depicts an isometric view of an example thermally controlled showerhead; FIG. 2 depicts an isometric cutaway view of the example thermally controlled showerhead of FIG. 1. In FIGS. 1 and 2, a showerhead 100 is shown. The showerhead 100 includes a faceplate 114, which may have a large number of gas distribution holes 144 in the underside (not visible in FIG. 1, but see FIG. 2). The faceplate 114 may be connected with a backplate 146, which may, in turn, be structurally and thermally connected with a cooling plate assembly 102 by a stem 112 and, in some implementations, a stem base 118. The stem 112 may include one or more holes, e.g., gun-drilled holes, that may be sized so as to receive, for example, a cartridge heater or a heater element 110. In the depicted example showerhead 100, there are three heater elements 110 that are positioned along three sides of a gas inlet 104 of the stem 112 and that extend along nearly the entire length of a central gas passage 138 (see FIG. 2). In some implementations, an additional hole or bore may be provided that extends to a similar depth and may be configured to receive a temperature probe, e.g., a thermocouple, that may be inserted therein to measure temperatures in the showerhead 100 close to the gas distribution plenum.

In the example showerhead of FIG. 1, the faceplate 114 may be connected with the backplate 146 by, for example, a circumferential weld or braze connection, e.g., at the seam just inside of the callout for the faceplate 114 in FIG. 1. The space between the faceplate 114 and the backplate 146 may act as a gas distribution plenum for the showerhead 100. In the depicted example, a baffle plate 142 is positioned within the gas distribution plenum to cause process gas that flows from the central gas passage 138 to flow radially outward before reaching a gas distribution port. The baffle plate 142 may be bonded to the faceplate 114 using, for example, a plurality of posts that may extend from the faceplate 114 to the baffle plate 142 and may be welded or swaged to the baffle plate 142.

Due to the high temperatures that a showerhead 100 such as that shown in FIG. 1 may experience during operation, the faceplate 114 may be additionally supported closer to the center of the faceplate 114 (where there will be the greatest amount of potential thermally related deflection in the faceplate 114) by a plurality of tensile supports, e.g., support posts 154 that extend upwards from the faceplate 114 within the gas distribution plenum of the showerhead 100 and into corresponding holes in the backplate 146; two such support posts 154 are visible in FIG. 2. The support posts 154 may then be bonded to the backplate 146, e.g., via welds or brazed connections. For example, a friction stir welding process may be used to join the support posts 154 to the backplate 146.

As can be seen from FIG. 2, the backplate 146 has a plurality of weld access holes (or braze access holes) 116, each of which has a corresponding support post of the faceplate 114 that plugs the inner end thereof. The interfaces between the support posts 154 and the bottoms of the weld access holes 116 may be relatively close fits, thereby allowing for easier welding or brazing.

Another characteristic of the backplate 146 is that the backplate 146 has a non-uniform radial thickness, getting larger the closer the backplate 146 is to the stem base 118. Such increased thickness may serve to increase the heat conduction cross-sectional area of the backplate 146 in tandem with the increased heat conduction needs of the faceplate 114 near the stem 112 as compared with the perimeter of the faceplate 114. Similarly, the stem base 118 may provide additional thermal mass that may provide additional heat flow paths for heat originating near the outer diameter of the faceplate 114. The stem base 118, however, may also include a plurality of longitudinal scallops 120 that extend in directions parallel to a center axis of the center gas passage 138; each such scallop 120 may provide clearance for a welding or brazing system to gain access to the weld access holes 116.

Figure 3:
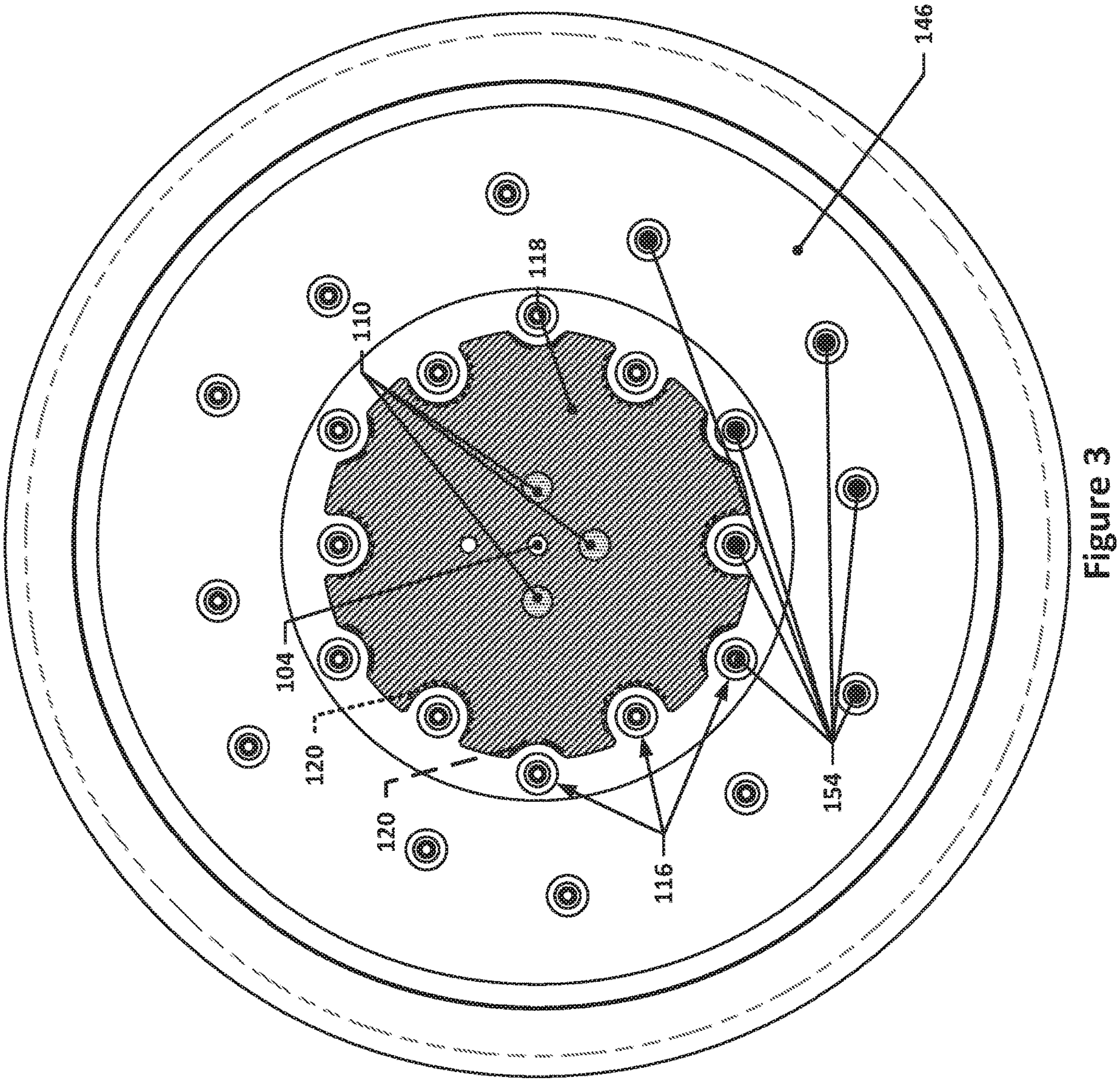
FIG. 3 depicts a top section view of the example thermally controlled showerhead of FIG. 1.

These longitudinal scallops 120 are more clearly depicted in FIG. 3, which depicts a top section view of the example thermally controlled showerhead of FIG. 1. As can be seen, there are two rings of 12 support posts 154, with the inner ring of 12 support posts 154 being positioned such that the weld access holes 116 for those support posts 154 overlap with the cross-section of the stem base 118. The longitudinal scallops 120 that are included permit access to the weld access holes 116 which, in turn, provide access to the tops of the support posts 154, thereby permitting them to be welded or brazed to the backplate 146.

The cooling plate assembly 102 may, as shown, have a layered construction, although other implementations may provide a similar structure using other manufacturing techniques, e.g., additive manufacturing or casting, but without the layered construction. The cooling plate assembly 102 may include a cover plate 132 that is bonded, e.g., via diffusion bonding or brazing, to a first plate 126, which is, in turn, bonded to a second plate 128, which is, in turn, bonded to a third plate 130. It will be understood that while such structures are referred to as "plates" in this application, they may include features that extend away from an otherwise generally planar surface, leaving the "plates" as having 3-dimensional structures that give such structures non-planar appearances.

Figure 4:
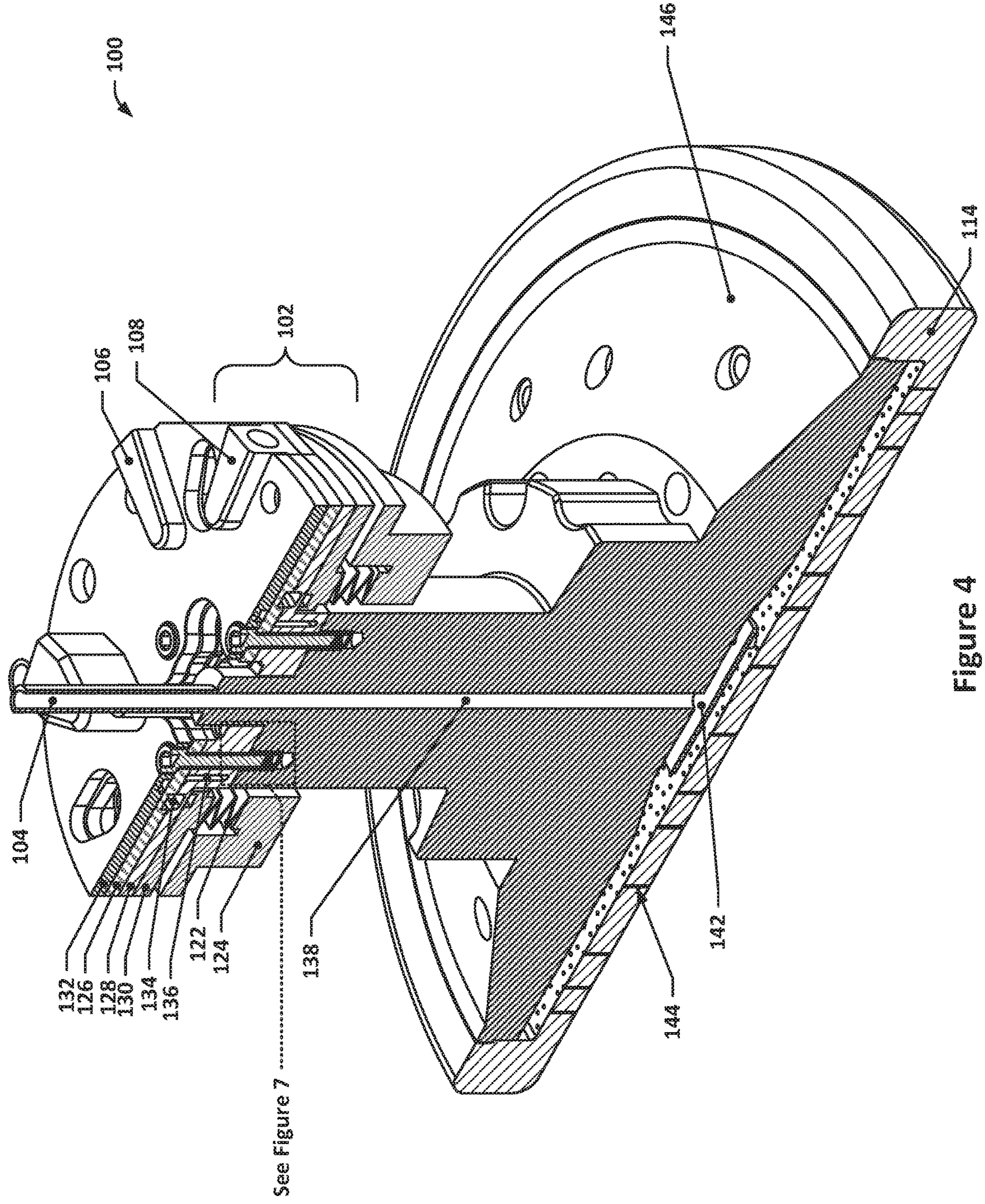
FIG. 4 depicts another isometric cutaway view of the example thermally controlled showerhead of FIG. 1.

As discussed above, the cooling plate assembly may be a bonded laminated structure. However, it may still be desirable to utilize fasteners to connect the cooling plate assembly 102 to the stem 112. In such implementations, the stem may include a plurality of threaded holes that may receive fasteners that are inserted through corresponding holes in the cooling plate assembly 102 and then tightened, thereby drawing the stem 112 into good thermal contact with the cooling plate assembly 102. This is shown in FIG. 4, which depicts another isometric cutaway view of the example thermally controlled showerhead of FIG. 1 taken with a different sectioning plane from FIG. 2. FIG. 4 also includes two clamping fasteners that are visible extending through the cooling plate assembly 102 and into the stem 112; the interface between such clamping fasteners and the stem 112 is shown in a magnified view in FIG. 7, which is a detail view of the portion of FIG. 4 enclosed in the dotted rectangle.

Figure 5:
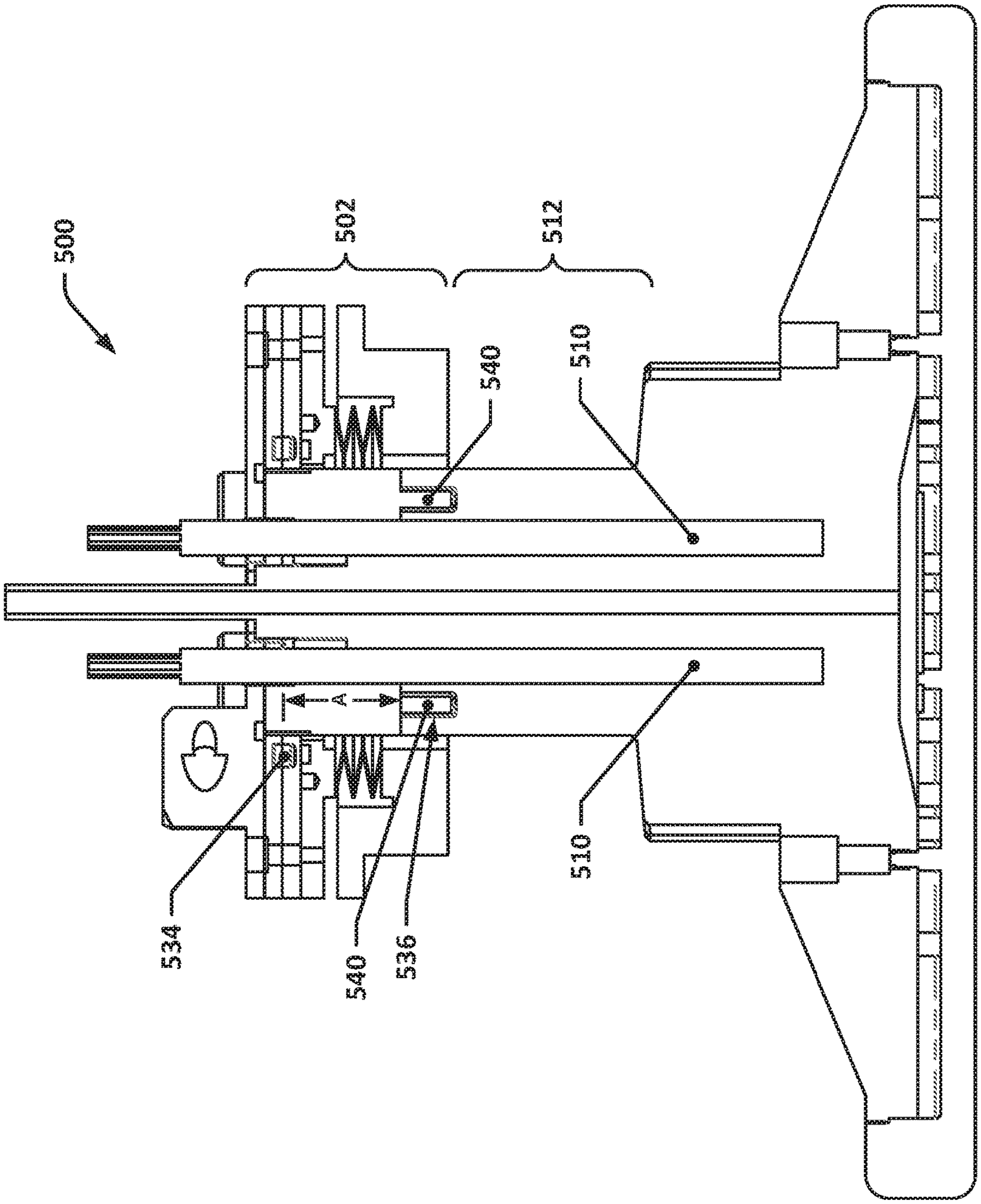
FIG. 5 depicts an example thermally controlled showerhead with a different inner cooling channel configuration.

It will be appreciated as well that the inner cooling channel feature 136 in the cooling plate assembly 102 may also be vertically shifted from the location shown in the Figures. For example, in some implementations, the inner cooling channel 136 may be vertically offset downward (or extended in depth downward) so as to have a bottommost surface (closest to the faceplate 114) that is closer to the faceplate 114 than as depicted. FIG. 5, for example, depicts a showerhead 500 in which an inner cooling channel 536 is displaced vertically downward from the location shown in the showerhead 100 relative to an outer cooling channel 534. For example, the top of the inner cooling channel 136 is generally shown as being at the same elevation as the outer cooling channel 134 in FIG. 2, whereas the top of the inner cooling channel 536 is displaced downward by distance A from the elevation of the outer cooling channel 534 so that at least the horizontal portions of the inner cooling channel 536 and the outer cooling channel 534 do not overlap with each other when viewed along a horizontal axis (perpendicular to the center axis of the showerhead). In such an implementation, the cooling effects of the inner cooling channel 536 and the outer cooling channel 534 may be vertically staggered, with the inner cooling channel 536 increasingly acting to remove heat from the stem 512 and the outer cooling channel 534 increasingly acting to remove heat from the heater cores 510. As can be seen, the cooling plate assembly 502 extends downward to a greater extent than the cooling plate assembly 102 and, in some respects, may be viewed as forming part of the stem 512. In some implementations, as shown in FIG. 5, the inner cooling channel 536 may actually be machined into the upper face of the stem 512, and the cooling plate assembly 502 may have ports and channels that may provide cooling fluid to the inner cooling channel 536 as well as protrusions 540 that extend thereinto. There may be vertical riser passages that connect between the inner cooling channel 536 and the outer cooling channel 534 so as to allow cooling fluid to be flowed between the two vertically separated channels. In other implementations, the inner cooling channel 536 may still be vertically displaced downward from the outer cooling channel 534 but with the inner cooling channel 536 still completely contained within the structure of the cooling plate assembly, as with the implementation of FIG. 2 (thus avoiding direct contact between the cooling fluid and the stem 512).

Figure 6:
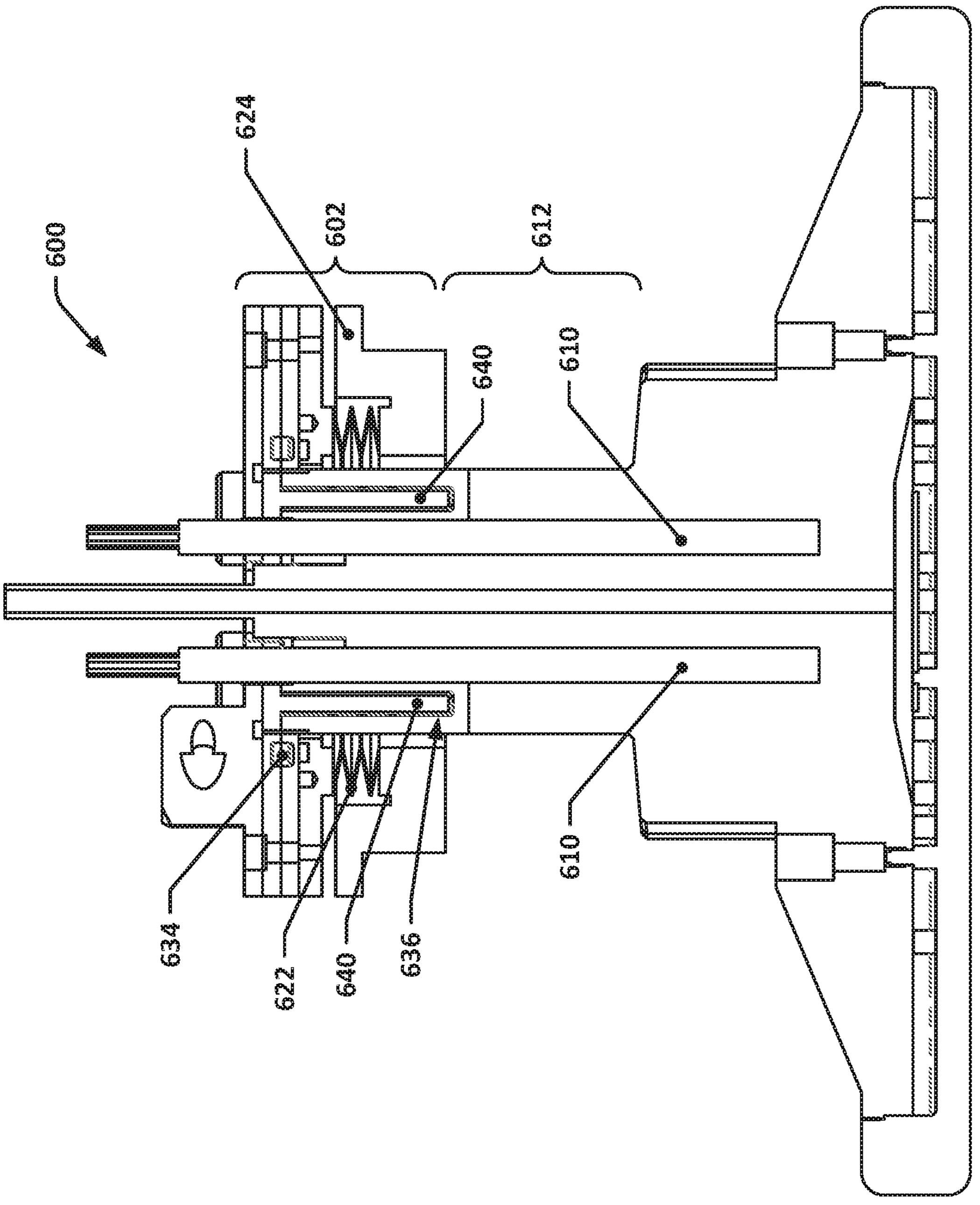
FIG. 6 depicts another example thermally controlled showerhead with a different inner cooling channel configuration.

In some other implementations, such as that shown in FIG. 6, an inner cooling channel 636 for a showerhead 600 may be provided that extends to a much deeper depth downward than shown in FIG. 2. In such examples, a greater amount of surface area may be provided within the inner cooling channel 636 to allow for increased amounts of heat exchange to occur, thereby increasing the cooling capacity of such cooling channels. The inner cooling channel 636 may, for example, extend past the bottom of bellow 622 and may, as shown in FIG. 6, even extend past the bottom of mounting flange 624 of cooling plate assembly 602. Protrusions 640 may be correspondingly longer so as to extend nearly to the bottom of the inner cooling channel 636, as shown in FIG. 6. Similar to earlier examples, however, an outer cooling channel 634 may be provided at a higher elevation in the cooling plate assembly 602.

Figure 7:
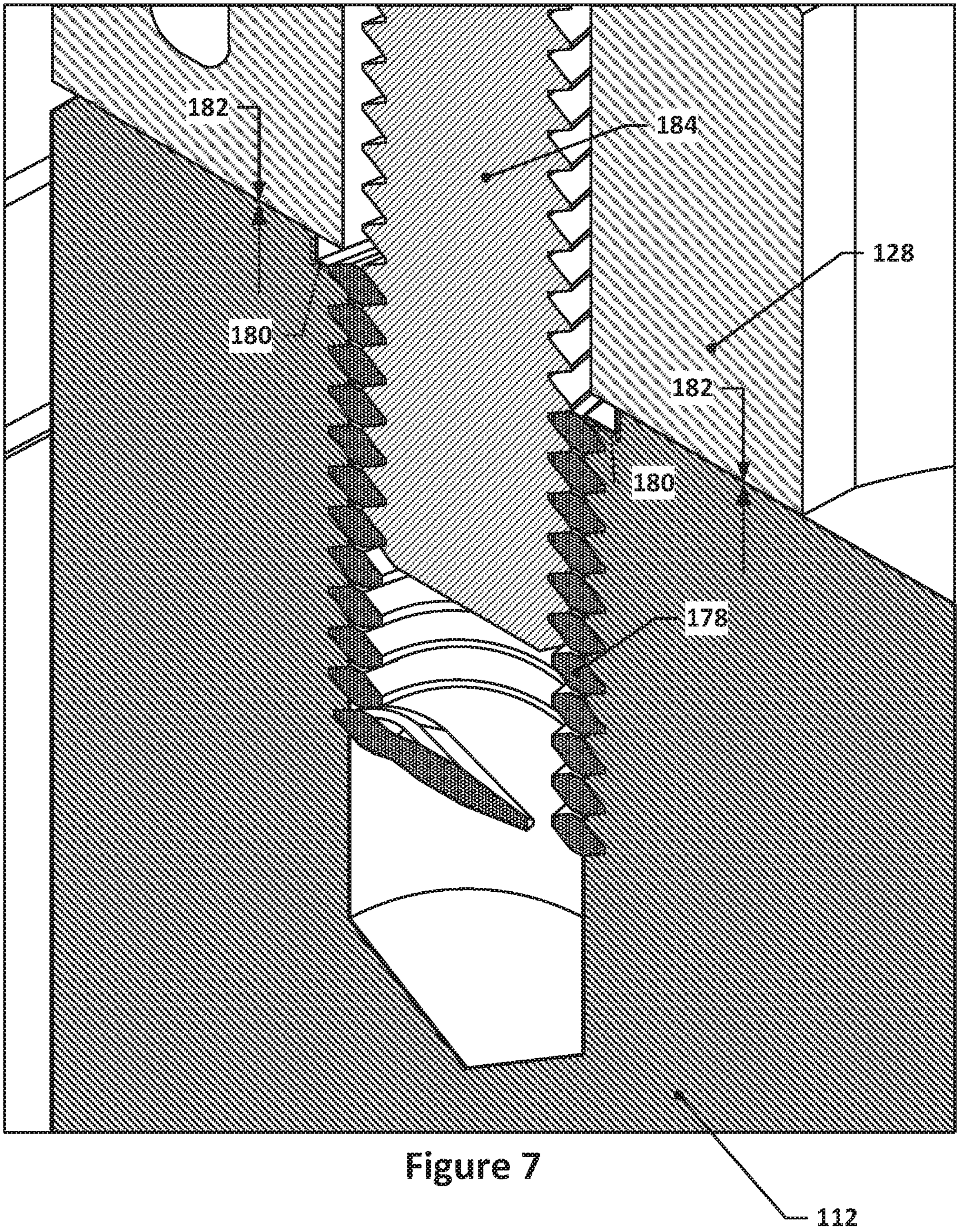
FIG. 7 is a detail view of a portion of FIG. 4.

As can be seen in FIG. 7, the stem 112 may have blind threaded holes in it that may receive clamping fasteners 184. In this particular example, the blind threaded holes are equipped with helical thread inserts 178 to avoid stripping out the stem 112 material from the holes when the clamping fasteners 166 are tightened. The surfaces where the stem 112 and the second plate 128 contact may serve as thermal contact surfaces 182 and may be the primary interface for conveying heat from the stem 112 into the cooling plate assembly 102. In order to enhance the thermal conductivity across this interface, the clamping fasteners may be subjected to significant torque so as to more adequately tightly compress the stem 112 against the second plate 128 and increase the thermal conductivity across the interface. A key feature for accomplishing this is found in counterbore 180, the purpose of which is discussed below.

Figure 8:
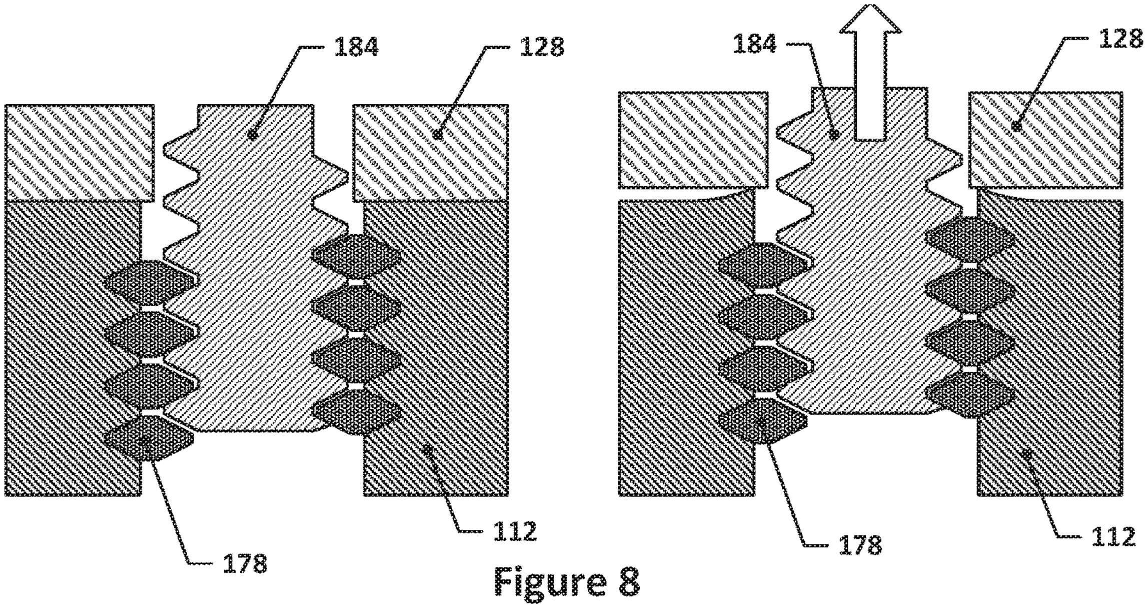
FIG. 8 is a schematic of a threaded joint between two members.

FIG. 8 is a schematic of a threaded joint between two members. These two members may, for example, be the stem 112 and the second plate 128. A helical insert 178 may be provided in a hole in the stem 112, and a clamping fastener 184 may be threaded therein. The image on the left shows this interface prior to the threaded fastener 184 being torqued to any significant value. The image on the right shows what may happen when the clamping fastener 184 is torqued, thereby placing the clamping fastener in tension and pulling the helical insert 178 upwards. This causes the material that the helical insert 178 is embedded in, e.g., the aluminum of the stem 112, to distend or bulge upwards somewhat, as shown in the right image. This may cause a slight gap (exaggerated here for clarity) to open up between the two members, at least in the area around each threaded insert/hole. Such a gap may interfere with heat transfer and may reduce the heat transfer efficiency of the interface between the two members.

Figure 9:
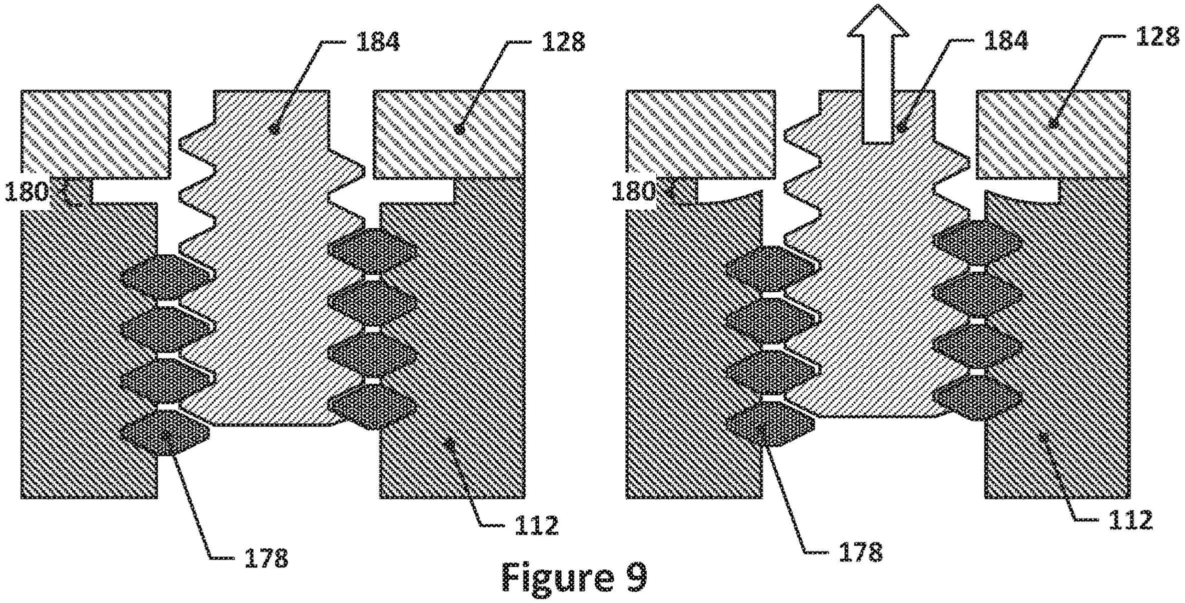
FIG. 9 is a schematic of another threaded joint between two members.

FIG. 9 is a schematic of another threaded joint between two members. In this example, the same configuration is shown as in FIG. 8, except that a counterbore 180 has been included around the threaded insert in the stem 112. The counterbore provides a setback that allows for localized distortion or bulging of the material of the stem 112 when the clamping fastener 184 is torqued and placed under tension. The setback ensures that the bulging or distortion of the stem 112 does not cause a gap to form between the stem 112 and the second plate 128, thereby ensuring that a high-quality thermal contact interface is retained between the two parts. In some implementations, the counterbore may be provided on the other member, e.g., the second plate 128, or on both members.

The cooling plate assembly 102 may include an inner cooling channel 136 that extends generally around the stem 112 and which may be fluidically connected within the cooling plate assembly 102 so as to cause coolant flowed therethrough from a coolant inlet 106 to subsequently flow through an outer cooling channel 134, which may encircle (or at least partially encircle) the inner cooling channel 136, before flowing to a coolant outlet 108.

When the showerhead 100 is installed in a semiconductor processing system, it may be connected to several additional systems. For example, the heater elements 110 may be connected with a heater power supply 164 that may provide electrical power to the heater elements 110 under the direction of a controller 166. The controller 166 may, for example, have one or more processors 168 and one or more memory devices 170. The one or more memory devices may, as discussed later herein, store computer-executable instructions for controlling the one or more processors to perform various functions or control various other pieces of hardware.

The controller 166 of FIG. 1 may also be operatively connected with a valve 158, which may be controlled by the controller 166 so as to cause process gas from a gas supply 156 to be supplied (or no longer supplied) to the showerhead 100. The gas supply 156 may be configured, for example, to provide one or more processing gases to the showerhead 100, e.g., gases such as nitrogen ($N_2$), oxygen ($O_2$), hydrogen ($H_2$), ammonia ($NH_3$), nitrogen trifluoride ($NF_3$), silane ($SiH_4$), tetraethyl orthosilicate (TEOS) vapor, etc. Similarly, the controller 166 may be operatively connected with a pump 162 which may be controlled by the controller so as to cause a cooling liquid or fluid to be circulated through the inner cooling channel 136 and the outer cooling channel 134 and back into a coolant reservoir 160 before being flowed back to the cooling plate assembly 102.

The showerhead 100 of FIGS. 1 and 2 may also include a mounting flange 124 that may be connected to the cooling plate assembly 102 by a bellows 122, which may act to provide a compliant and gas-tight connection between the mounted flange 124 and the cooling plate assembly 102. The mounting flange 124, the bellows 122, and the third plate 130 may be made, for example, of a stainless steel alloy, whereas the first plate 126 and the second plate 128 may be made, for example, of an aluminum alloy to encourage additional heat transfer.

Figure 11:
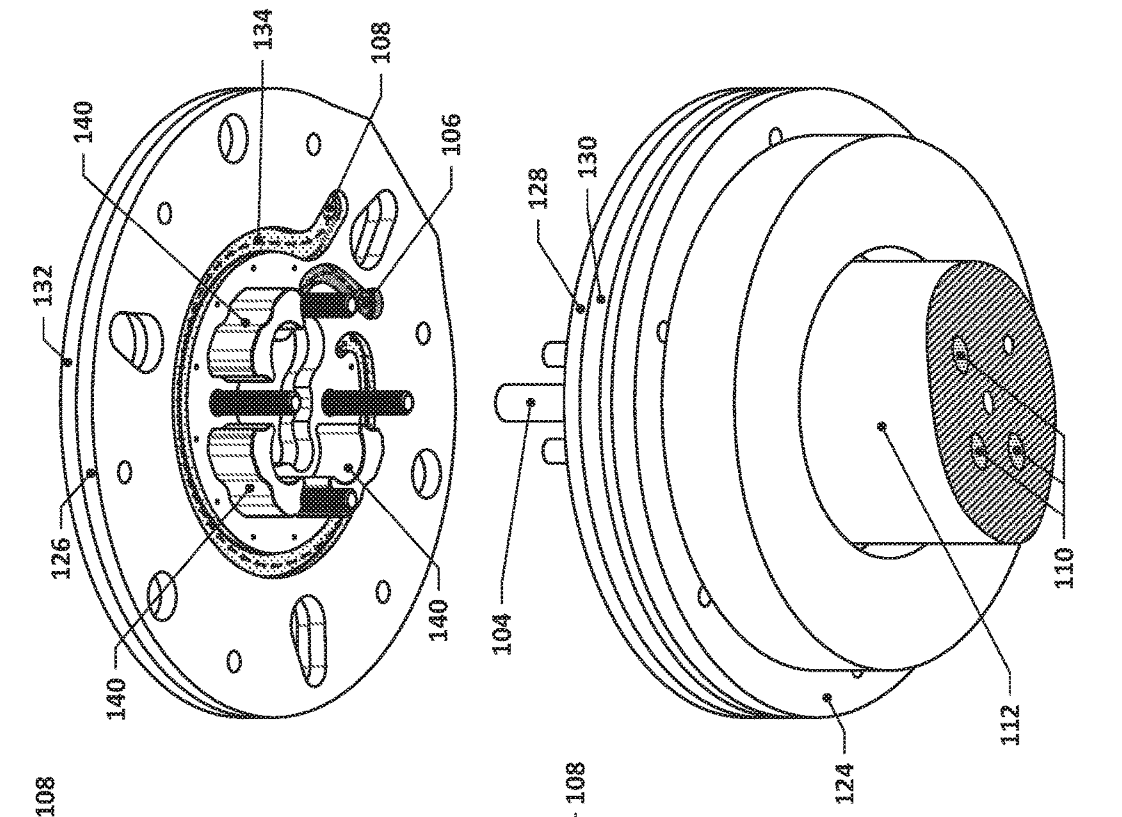
FIG. 11 depicts another isometric partial exploded view f the portion of the thermally controlled showerhead of FIG. 10.
Figure 10:
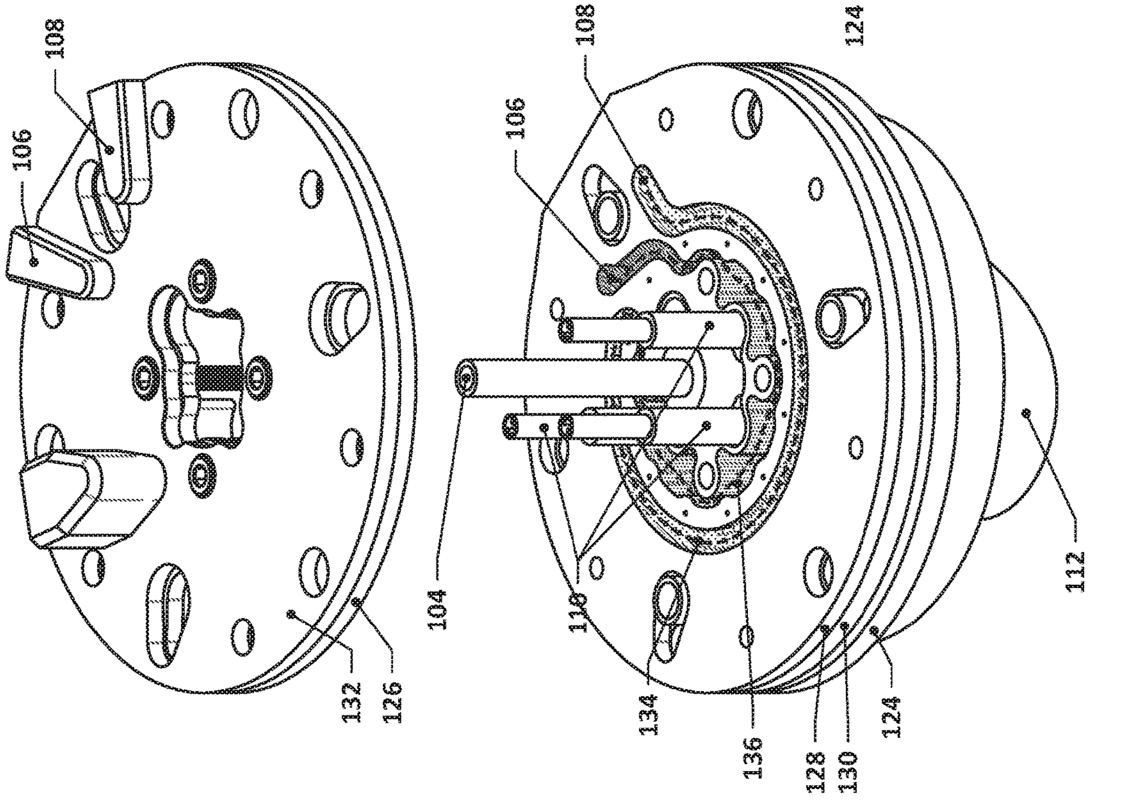
FIG. 10 depicts an isometric partial exploded view of a portion of the thermally controlled showerhead of FIG. 1.
Figure 12:
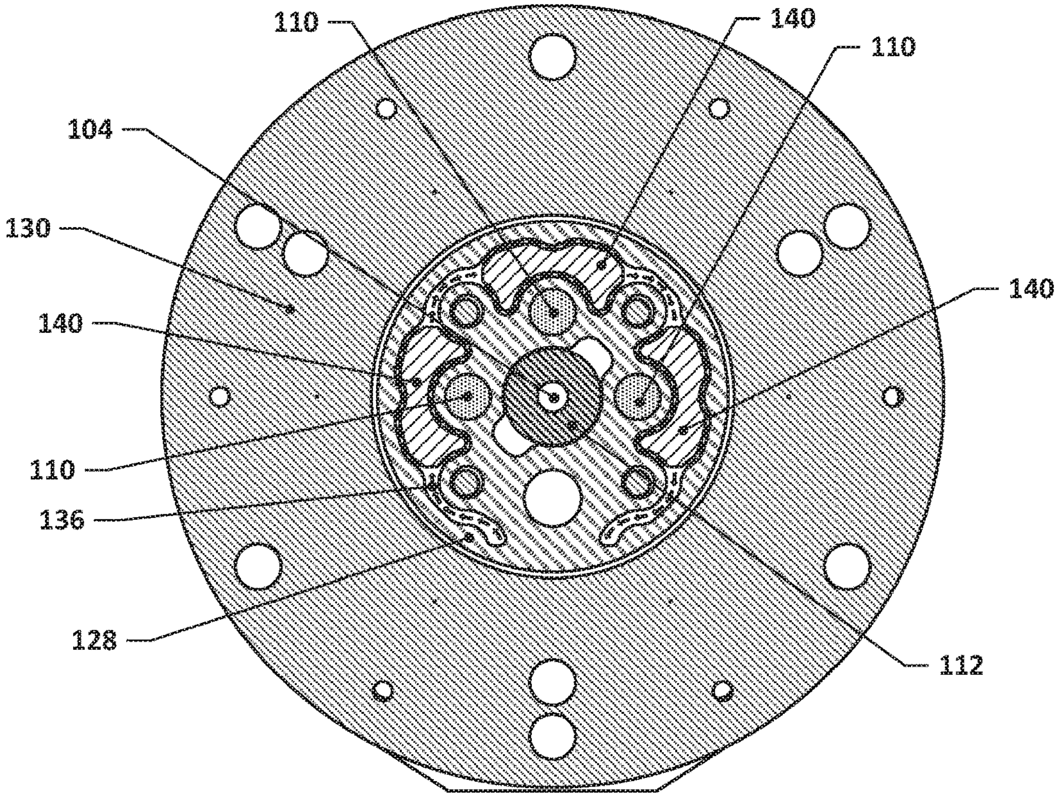
FIG. 12 depicts a section view of a cooling plate assembly of the example thermally controlled showerhead of FIG. 1.
Figure 13:
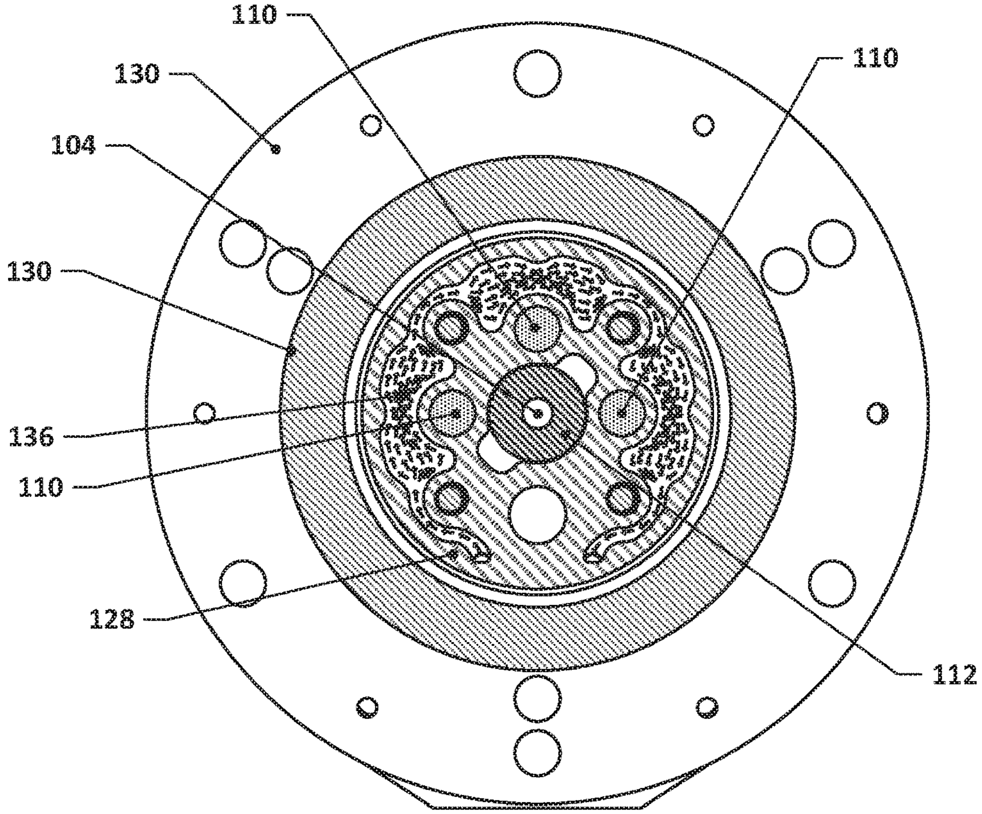
FIG. 13 depicts another section view of a cooling plate assembly of the example thermally controlled showerhead of FIG. 1.
Figure 14:
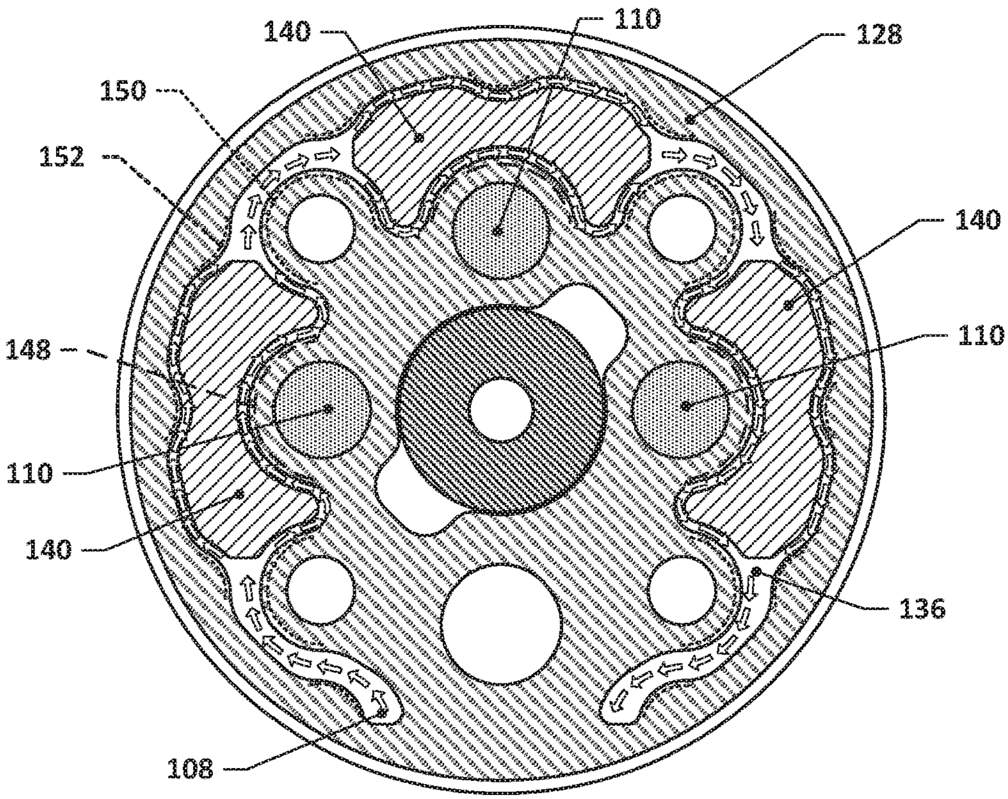
FIG. 14 depicts a detail view of FIG. 12.
Figure 15:
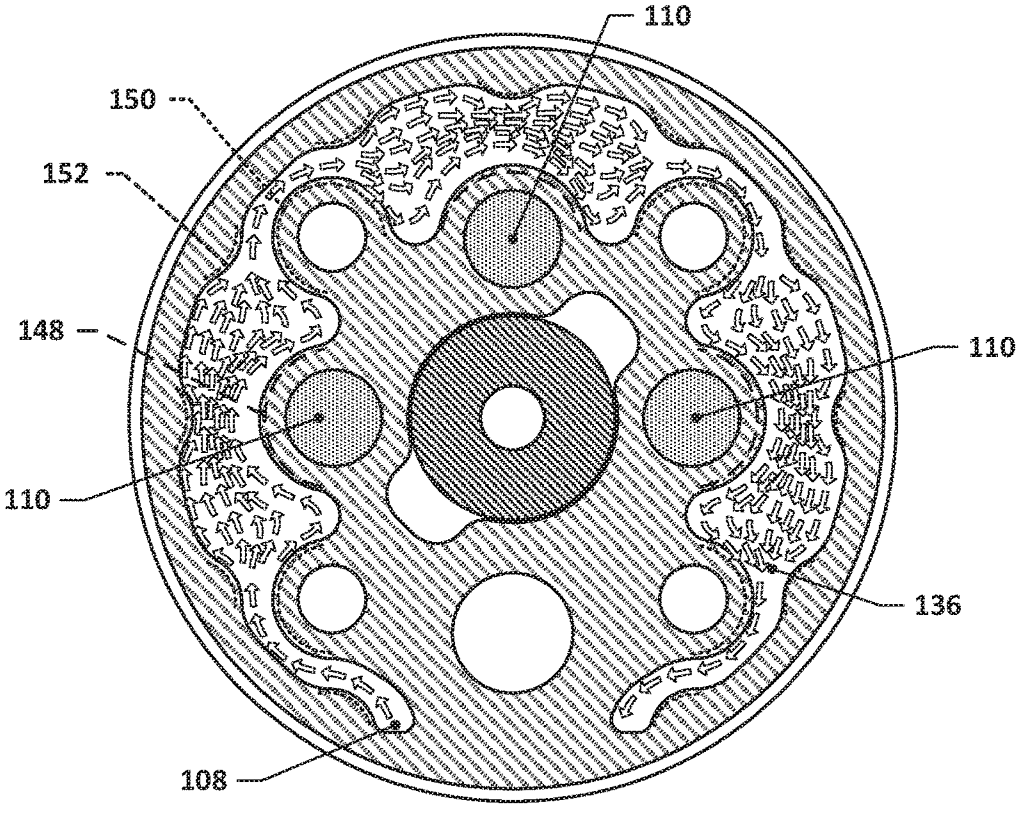
FIG. 15 depicts a detail view of FIG. 13.

Further details of the cooling plate assembly are discussed below with respect to FIGS. 10-45. FIGS. 10 and 11 depict isometric partial exploded views of a portion of the thermally controlled showerhead of FIG. 1. FIGS. 12 and 13 depict section views of the cooling plate assembly of the example thermally controlled showerhead of FIG. 1. FIGS. 14 and 15 depict detail views of FIGS. 12 and 13, respectively.

In FIGS. 10 and 11, the cover plate 132 and the first plate 126 have both been removed, exposing the cooling flow paths within the cooling plate assembly 102. As can be seen, the central gas passage 138 may be located in close proximity to the heater cartridges 110, which may be used to provide heat to the gases flowed within the central gas passage 138. The inner cooling channel 136 and the outer cooling channel 134 are clearly visible. As can be seen, the outer cooling channel 134 is formed by two matching channels in the first plate 126 and the second plate 128 that align when the various plates are assembled. The outer cooling channel 134 may extend around all or nearly all, e.g., ~300° of arc, of the central gas passage 138. One end of the outer cooling channel 134 may be fluidically connected with the inner cooling channel 136, which may allow coolant that is flowed through the inner cooling channel 136 to subsequently be flowed through the outer cooling channel 134 without leaving the cooling plate assembly and then through the coolant outlet 108.

As can be seen in FIG. 11, the first plate 126 has a first surface that is bonded to a second surface of the second plate 128 to form part of the cooling plate assembly. The first surface may optionally include one of the matching channels discussed above, as well as a plurality of protrusions 140, each of which may be placed and sized so as to protrude into a correspondingly or similarly shaped portion of the inner cooling channel 136, thereby forming a fluid flow passage having a very thin, U-shaped cross-section that generally causes the fluid that is flowed through the inner cooling channel 136 to accelerate in the regions where the protrusions are, thereby increasing the Reynolds number of the cooling fluid in such regions and increasing heat transfer between the cooling fluid and the walls of the inner cooling channel 136, and between the cooling fluid and the protrusions 140; this increases the cooling efficiency of the inner cooling channel 136.

The effect of the protrusions may be more clearly seen in FIGS. 12-15, which show the inner cooling channel 136 in more detail, including the protrusions 140. As can be seen in FIG. 14, the inner wall of the inner cooling channel 136 may include a number of first convex lobes 148. The first convex lobes 148 may be centered on the bores for the heater cartridges, for example, and may be sized such that approximately the same wall thickness exists between each heater cartridge and the inner cooling passage 136 and the portion of the stem that passes through the cooling plate assembly at that location. The inner wall, in some implementations, may also have a plurality of second convex lobes 150, e.g., which may be included to allow the inner cooling channel 136 to navigate around, for example, fastener through-holes or other features of the cooling plate assembly 102. In some implementations, the outer wall of the inner cooling channel 136 may also have a plurality of third convex lobes 152, which may, for example, be provided to provide sufficient wall thickness between the inner cooling channel 136 and an array of internal gas riser ports (see small riser ports visible in FIG. 10 between the inner cooling channel 136 and the outer cooling channel 134). In the depicted example, the protrusions 140 each have a corresponding first concave recess that has one of the first convex lobes nestled within it, separate from the protrusion by a corresponding gap. Similarly, the protrusions 140 also each have a second concave recess on the opposite side from the first concave recess, thereby allowing one of the third convex lobes 152 to be nestled within the second concave recess. Such complementarily shaped inner cooling channel side walls and protrusions 140 may provide relatively narrow, deep cooling flow paths that may provide a large surface area for heat transfer while also increasing the velocity of the cooling fluid.

As can be seen in FIG. 15, the protrusions 140 may not extend all the way to the bottom of the inner cooling channel 136, leaving a relatively large-area flow region in between the bottom of the inner cooling channel 136 and the facing surfaces of the protrusions 140. The protrusions 140 may be sized such that the gap between the bottom of the inner cooling channel 136 and the facing surface of the protrusions 140 is approximately the same as the gap between the side walls of the inner cooling channel 136 and the facing surfaces or side walls of the protrusions 140. For example, in the example showerhead 100, the gap between the side walls of the inner cooling channel 136 and the facing surfaces or side walls of the protrusions 140 is approximately 1 mm, and the gap between the bottom of the inner cooling channel 136 and the facing surface of the protrusions 140 is approximately 1.3 mm. The protrusions 140, in this example, extend approximately 14 mm from the first plate 126; this results in the inner cooling channel having a volume of approximately 7.2 cubic cm. In comparison, the outer cooling channel, which has height of approximately 6 mm and width of approximately 6.3 mm, has a volume of approximately 9.6 cubic cm; an additional approximately 1.4 cubic cm and 0.8 cubic cm are contributed by the volumes of the inlet and outlet within the cooling plate assembly, respectively. In such an arrangement, a coolant flow of approximately 3800 to 5700 cubic cm per minute may be supplied to the cooling channels, resulting in approximately 200 to 300 complete replacements of the cooling fluid within the cooling channels of the cooling plate assembly 102 per minute; cooling fluids such as water, fluorinated coolants (such as Galden® PFPE from Solvay), or other cooling liquids. This may allow the cooling plate assembly to be kept at a temperature of approximately 20° C. to 60° C. while the showerhead faceplate 114 is kept at a temperature of approximately 300° C. to 360° C., e.g., 350° C. It will be understood that the particular dimensions and performance characteristics discussed above with respect to the example showerhead 100 are not intended to be limiting, and that other showerheads with different dimensional and performance characteristics may fall within the scope of this disclosure as well.

It will be further noted that the protrusions 140 extend downward from the first plate 126, towards the faceplate 114. Thus, heat from the faceplate 114 and stem 112 may flow along the sidewalls of the inner cooling channel 136 and towards the first plate 126, as well as from the first plate 126 and to the ends of the protrusions 140, i.e., in the opposite direction. This may have the effect of evening out the heating of the coolant flowing through the inner cooling channel, as the temperature gradient of the inner cooling channel 136 side walls may be highest at the bottom of the inner cooling channel 136, i.e., closest to the faceplate 114, and lowest near the top of the inner cooling channel 136, i.e., near the first plate 126, whereas the temperature gradient in the protrusions 140 may be reversed, i.e., with the highest temperature near the first plate 126 and the lowest temperature near the bottom of the inner cooling channel 136. This promotes more efficient heat transfer.

Figure 16:
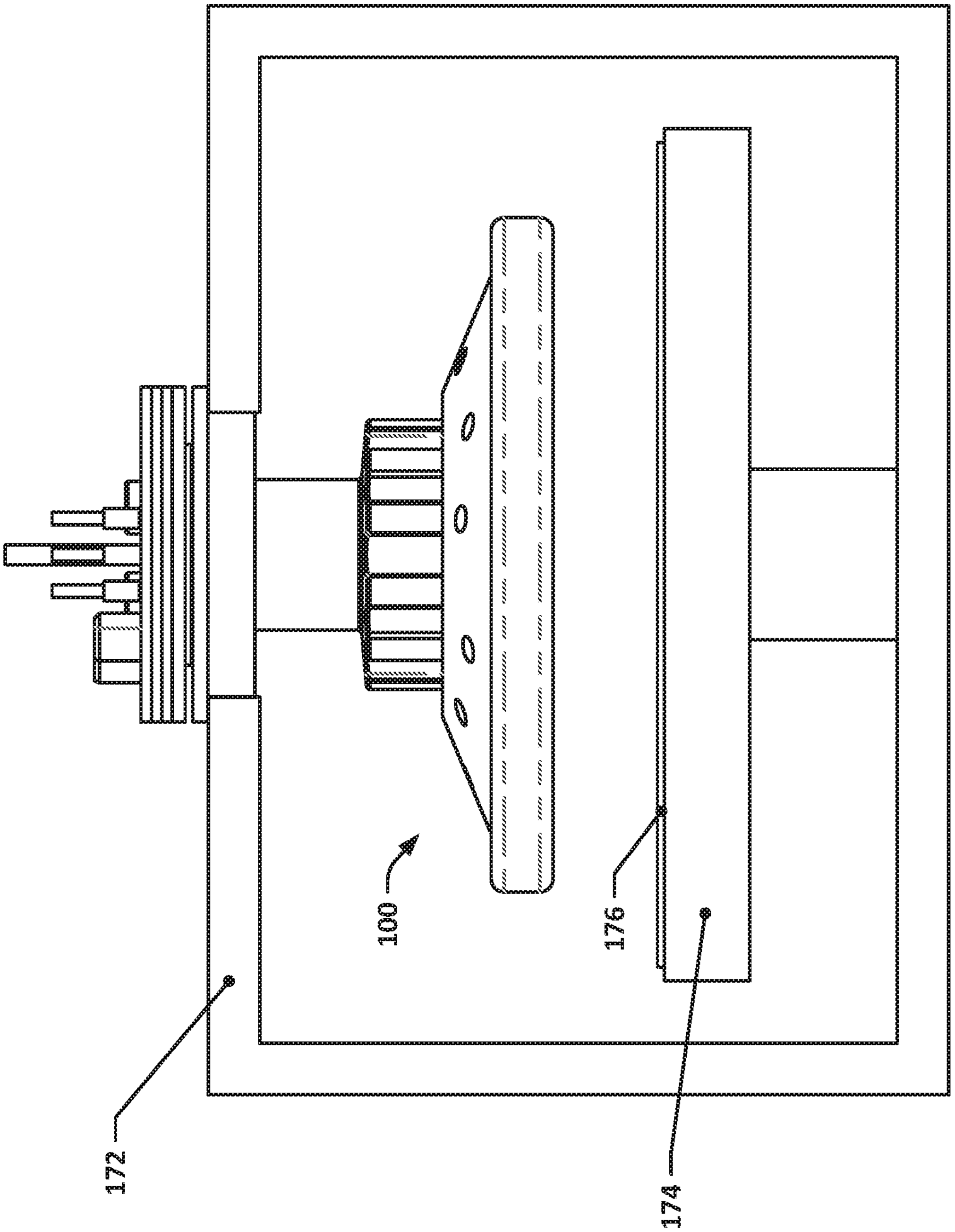
FIG. 16 depicts a schematic of a semiconductor processing chamber with the example thermally controlled showerhead of FIG. 1 installed.

FIG. 16 depicts a schematic of a semiconductor processing chamber with the example thermally controlled showerhead of FIG. 1 installed. In such an arrangement, a semiconductor processing chamber 172 may be provided that includes a pedestal 174, a thermally controlled showerhead 100. The showerhead 100 may be positioned above the pedestal 174, and may be configured to flow processing gas or gases over a wafer 176 that may be placed on the pedestal 174. The showerhead 100 may be connected with one or more additional pieces of equipment, e.g., such as shown in FIG. 1.

As mentioned above, the various controllable components discussed herein, e.g., valves to gas supplies, heater power units, coolant pumps, etc., may be controlled by a controller of a semiconductor processing tool. The controller may be part of a system that may include semiconductor processing equipment, including a processing tool or tools, chamber or chambers, platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, as well as various parameters affecting semiconductor processing, such as the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The term "wafer," as used herein, may refer to semiconductor wafers or substrates or other similar types of wafers or substrates. A wafer station, as the term is used herein, may refer to any location in a semiconductor processing tool in which a wafer may be placed during any of various wafer processing operations or wafer transfer operations. Wafer support is used herein to refer to any structure in a wafer station that is configured to receive and support a semiconductor wafer, e.g., a pedestal, an electrostatic chuck, a wafer support shelf, etc.

References herein to "substantially," "approximately," or the like may be understood, unless otherwise indicated, to refer to values or relationships within ±10% of those stated. For example, two surfaces that are substantially perpendicular to one another may be either truly perpendicular, i.e., at 90° to one another, at 89° or 91° to one another, or even as far as at 80° or 100° to one another.

It is also to be understood that any use of ordinal indicators, e.g., (a), (b), (c), . . . , herein is for organizational purposes only, and is not intended to convey any particular sequence or importance to the items associated with each ordinal indicator. There may nonetheless be instances in which some items associated with ordinal indicators may inherently require a particular sequence, e.g., "(a) obtain information regarding X, (b) determine Y based on the information regarding X, and (c) obtain information regarding Z"; in this example, (a) would need to be performed (b) since (b) relies on information obtained in (a)-(c), however, could be performed before or after either of (a) and/or (b).

It is to be understood that use of the word "each," such as in the phrase "for each <item> of the one or more <items>" or "of each <item>," if used herein, should be understood to be inclusive of both a single-item group and multiple-item groups, i.e., the phrase "for . . . each" is used in the sense that it is used in programming languages to refer to each item of whatever population of items is referenced. For example, if the population of items referenced is a single item, then "each" would refer to only that single item (despite the fact that dictionary definitions of "each" frequently define the term to refer to "every one of two or more things") and would not imply that there must be at least two of those items. Similarly, when a selected item may have one or more sub-items and a selection of one of those sub-items is made, it will be understood that in the case where the selected item has one and only one sub-item, selection of that one sub-item is inherent in the selection of the item itself.

It will also be understood that references to multiple controllers that are configured, in aggregate, to perform various functions are intended to encompass situations in which only one of the controllers is configured to perform all of the functions disclosed or discussed, as well as situations in which the various controllers each perform subportions of the functionality discussed.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Certain features that are described in this specification in the context of separate implementations also can be implemented in combination in a single implementation. Conversely, various features that are described in the context of a single implementation also can be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An apparatus comprising:

a showerhead that includes:

- a faceplate;
- a backplate;
- a gas distribution plenum interposed between the faceplate and the backplate;
- a stem including a gas inlet;
- one or more heater elements;
- an inner cooling channel;
- an outer cooling channel; and
- a cooling plate assembly, wherein:
  - the stem is supported by the cooling plate assembly and extends from the cooling plate assembly along a center axis,
  - the one or more heater elements are located at least partially within the stem and extend at least along a direction parallel to the center axis,
  - the cooling plate assembly includes at least the outer cooling channel,
  - the outer cooling channel extends around the inner cooling channel when viewed along the center axis,
  - the inner and outer cooling channels both extend around the one or more heater elements when viewed along the center axis,
  - the cooling plate assembly includes a plurality of through-holes,
  - the stem includes a plurality of threaded holes in a top face of the stem,
  - each threaded hole in the plurality of threaded holes is aligned with one of the through-holes in the plurality of through-holes in the cooling plate assembly,
  - the top face of the stem is butted up against a bottom face of the cooling plate assembly,
  - a corresponding clamping fastener is inserted through each through-hole of the plurality of through-holes in the cooling plate assembly and threaded into the threaded hole in the plurality of threaded holes in the stem aligned therewith,
  - counterbores exist in one or both of the top face of the stem and the bottom face of the cooling plate assembly, and
  - each counterbore is centered on one of the through-holes in the plurality of through-holes through the cooling plate assembly.

2. The apparatus of claim 1, further comprising a stem base, wherein:

- the stem base is interposed between the backplate and the stem,
- the stem base is a larger in size than the stem when viewed along the center axis, and
- the stem base is smaller in size than the backplate when viewed along the center axis.

3. The apparatus of claim 2, wherein:

the stem base includes a plurality of scallops arranged along an outer perimeter of the stem base when viewed along the center axis, the back plate includes a corresponding plurality of weld access holes, and each weld access hole is collocated with one scallop of the plurality of scallops.

4. The apparatus of claim 2, wherein each of the one or more heater elements extends from the cooling plate assembly to a location in between the gas distribution plenum and the stem base.

5. The apparatus of claim 1, wherein there are at least three heater elements.

6. The apparatus of claim 1, wherein:

the cooling plate assembly includes a first plate and a second plate, a first surface of the first plate is bonded to a second surface of the second plate, the inner cooling channel extends into the second surface of the second plate and away from the first surface, and the first plate includes one or more protrusions that extend from the first surface, into one or more corresponding portions of the inner cooling channel, and towards the backplate.

7. The apparatus of claim 6, wherein:

the inner cooling channel includes an inner side wall and an outer side wall, the inner side wall is encircled by the outer side wall, and the inner side wall includes a plurality of first convex lobes arranged in a first radial pattern.

8. The apparatus of claim 7, wherein each protrusion includes a first concave recess within which is nestled one of the first convex lobes in the plurality of first convex lobes.

9. The apparatus of claim 8, wherein:

the inner side wall includes a plurality of second convex lobes arranged in a second radial pattern.

10. The apparatus of claim 9, wherein:

the outer side wall includes a plurality of third convex lobes arranged in a third radial pattern.

11. The apparatus of claim 10, wherein:

each first convex lobe in the plurality of first convex lobes is positioned across the inner cooling channel from a corresponding one of the third convex lobes in the plurality of third convex lobes.

12. The apparatus of claim 11, wherein:

each protrusion includes a second concave recess on a side of the protrusion opposite the first concave recess of the protrusion, and one of the third convex lobes in the plurality of third convex lobes is nestled within each of the second concave recesses.

13. The apparatus of claim 11, wherein:

each second convex lobe in the plurality of second convex lobes is circumferentially interposed in between two adjacent third convex lobes.

14. The apparatus of claim 6, wherein the one or more protrusions includes three protrusions.

15. The apparatus of claim 6, wherein a gap exists between the second plate and each protrusion in the one or more protrusions.

16. The apparatus of claim 6, wherein at least a first protrusion of the one or more protrusions does not contact the second plate.

17. The apparatus of claim 1, wherein the counterbores are in the top face of the stem.

18. The apparatus of claim 17, wherein the threaded holes have threads provided by helical inserts.

* * * * *